(12) United States Patent
Rappe et al.

(10) Patent No.: US 9,484,475 B2
(45) Date of Patent: Nov. 1, 2016

(54) SEMICONDUCTOR FERROELECTRIC COMPOSITIONS AND THEIR USE IN PHOTOVOLTAIC DEVICES

(71) Applicants: Andrew M Rappe, Penn Valley, PA (US); Peter K Davies, Newtown, PA (US); Jonathan E Spanier, Bala Cynwyd, PA (US); Ilya Grinberg, Fair Lawn, NJ (US); Don Vincent West, Minneapolis, MN (US)

(72) Inventors: Andrew M Rappe, Penn Valley, PA (US); Peter K Davies, Newtown, PA (US); Jonathan E Spanier, Bala Cynwyd, PA (US); Ilya Grinberg, Fair Lawn, NJ (US); Don Vincent West, Minneapolis, MN (US)

(73) Assignees: The Trustees Of The University Of Pennsylvania, Philadelphia, PA (US); Drexel University, Philadelphia, PA (US)

( * ) Notice: Subject to any disclaimer, the term of this patent is extended or adjusted under 35 U.S.C. 154(b) by 663 days.

(21) Appl. No.: 13/649,154

(22) Filed: Oct. 11, 2012

(65) Prior Publication Data

US 2013/0104969 A1 May 2, 2013

Related U.S. Application Data

(60) Provisional application No. 61/545,932, filed on Oct. 11, 2011.

(51) Int. Cl.
*H01L 31/032* (2006.01)
*H01L 31/0352* (2006.01)
*H01L 31/072* (2012.01)
(Continued)

(52) U.S. Cl.
CPC ............ *H01L 31/032* (2013.01); *C01G 33/00* (2013.01); *C01G 53/66* (2013.01); *C04B 35/495* (2013.01); *H01L 31/03529* (2013.01);
*H01L 31/072* (2013.01); *C01P 2002/34* (2013.01); *C01P 2002/50* (2013.01); *C01P 2006/40* (2013.01); *C04B 2235/3201* (2013.01);
(Continued)

(58) Field of Classification Search
CPC .......... H01L 31/032; H01L 31/03529; C01G 53/66
USPC ............................... 136/255, 252; 252/501.1
See application file for complete search history.

(56) References Cited

U.S. PATENT DOCUMENTS

2012/0305918 A1* 12/2012 Shum ................ H01L 21/02381
257/49

OTHER PUBLICATIONS

Alexe, et al., "Tip-Enhanced Photovoltaic Effects in Bismuth Ferrite", Nature Commun., Mar. 29, 2011, 2(256), 1-5.
(Continued)

*Primary Examiner* — Matthew Martin
*Assistant Examiner* — Tae-Sik Kang
(74) *Attorney, Agent, or Firm* — Baker & Hostetler LLP

(57) ABSTRACT

Disclosed herein are ferroelectric perovskites characterized as having a band gap, Egap, of less than 2.5 eV. Also disclosed are compounds comprising a solid solution of KNbO3 and BaNi1/2Nb1/2O3-delta, wherein delta is in the range of from 0 to about 1. The specification also discloses photovoltaic devices comprising one or more solar absorbing layers, wherein at least one of the solar absorbing layers comprises a semiconducting ferroelectric layer. Finally, this patent application provides solar cell, comprising: a heterojunction of n- and p-type semiconductors characterized as comprising an interface layer disposed between the n- and p-type semiconductors, the interface layer comprising a semiconducting ferroelectric absorber layer capable of enhancing light absorption and carrier separation.

8 Claims, 36 Drawing Sheets

Lamella $(KNbO_3)_{0.9}(BaNi_{0.5}Nb_{0.5}O_3)_{0.1}$

(51) Int. Cl.
  *C04B 35/495* (2006.01)
  *C01G 33/00* (2006.01)
  *C01G 53/00* (2006.01)
(52) U.S. Cl.
  CPC ......... *C04B 2235/3215* (2013.01); *C04B 2235/3279* (2013.01); *C04B 2235/3298* (2013.01); *C04B 2235/664* (2013.01); *C04B 2235/768* (2013.01); *C04B 2235/79* (2013.01); *Y02E 10/50* (2013.01)

(56) References Cited

OTHER PUBLICATIONS

Bartasyte, et al., "Temperature-Dependent Raman Scattering of $KTa_{1-x}Nb_xO_3$ Thin Films", Appl. Phys. Lett., Jun. 30, 2010, vol. 96, pp. 1-11.
Basu, et al., "Photoconductivity in $BiFeO_3$ Thin Films", Appl. Phys. Lett., Mar. 4, 2008, 92, 3 pgs.
Bennett, et al., "New Highly Polar Semiconductor Ferroelectrics Through d8 cation-O Vacancy Substitution into $PbTiO_3$: A Theoretical Study", J. Am. Chem. Soc., Nov. 21, 2008, vol. 130, 17409-17412.
Brody, "Temperature Dependence of the Short Circuit Photocurrent in Ferroelectric Ceramics", Ferroelectrics, Feb. 7, 2011, vol. 10(1), 143-146.
Cao, et al., High-Efficiency Ferroelectric-Film Solar Cells with an n-type $Cu_2O$ Cathode Buffer Layer, Nano Lett. May 14, 2012, vol. 12(6), 2803-2809.
Choi, et al., "Switchable Ferroelectric Diode and Photovoltaic Effect in $BiFeO_3$", Science, Apr. 3, 2009, vol. 324(5924), 63-66.
Choi, et al., "Wide Bandgap Tunability in Complex Transition Metal Oxides by Site-Specific Substitution", Nature Commun., Feb. 21, 2012, 3(689), 1-30.
Cohen, Origin of Ferroelectricity in Perovskite Oxides, Nature 358, Jul. 9, 1992, pp. 136-138.
Daranciang, et al., "Ultrafast Photovoltaic Response in Ferroelectric Nanolayers", Phys. Rev. Lett., Feb. 23, 2012, vol. 108, 7 pgs.
Giannozzi, et al. Quantum Espresso: A Modular and Open-Source Software Project for Quantum Simulations of Materials, J. Phys. Condens. Matter, Sep. 1, 2009 vol. 21(39).
Glass, et al., "High-Voltage Bulk Photovoltaic Effect and Photorefractive Process in $LiNbO_3$", Appl. Phys. Lett., Jun. 12, 1974, vol. 25, 233-235.
Gou, et al., "Post Density Functional Theoretical Studies of Highly Polar Semiconductive $Pb(Ti_{1-x} Ni_x)O_{3-x}$ Solid Solutions: Effects of Caption Arrangement on Band Gap", Phys. Rev., May 18, 2011, vol. B 83.
Grinberg, et al., "Local Structure and Macroscopic Properties in $Pb(Zn_{1/3}Nb_{2/3})O_3$-$PbTiO_3$ and $Pb(Mg_{1/3}Nb_{2/3})O_3$-$PbTiO_3$ Solid Solutions", Phys. Rev., Dec. 2, 2004, vol. B 70.
Grinberg. Et al., "Perovskite Oxides for Visible-Light-Absorbing Ferroelectric and Photovoltaic Materials", Nature, Nov. 28, 2013, vol. 503, 9 pgs.
Hybertsen, et al., "Electron Correlation in Semiconductors and Insulators: Band Gaps and Quasiparticle Energies", Phys. Rev., 1986, vol. 21(34), 5390-5413.
Inoue, et al., "Photoassisted Water Decomposition by Ferroelectric Lead Zirconate Titanate Ceramics with Anomalous Photovoltaic Effects", J. Phys. Chem., Jun. 1986, 90(13), 2809-2810.
Ji, et al., "Band Gap Tailored $Zn(Nb_{1-2x} V_xO_6)$ Solid Solutions as Visible Light Photocatalysts", J. Phys. Chem., Sep. 21, 2009, vol. C 113, 17824-17830.
Kim, et al., "Substitution Effect of Pentavalent Bismuth Ions on Electronic Structure and Physicochemical Properties of Perovskite-Structured $Ba(In_{0.5}Ta_{0.5})O_3$ Semiconductors", Mater. Res. Bull., Nov. 6, 2007, vol. 42, 1914-1920.
Kondo, et al., "Sintering Behavior and Surfacemicrostructure of PbO-rich $Pb(Ni_{1/3}Nb_{2/3})O_3$-$PbZrO_3$ Ceramics, J. Am. Ceram. Soc., Nov. 2001, vol. 84(11), 2469-2474.
Kreisel, et al., "A Photoferroelectric Material is More Than the Sum of Its Parts", Nature Mater., Mar. 22, 2012, 11(260).
Kroger, et al., "Relations Between the Concentrations of Imperfections in Crystalline Solids", 1956, vol. 3, 307-435.
Liang, et al., "A Thermodynamic Free Energy Function for Potassium Niobate", Appl. Phys., Feb. 20, 2009, Lett. 94, 3 pgs.
Park, et al., Ferroelectric Photocurrent Effect in Polycrystalline Lead-Free $(K_{0.5} Na_{0.5}) (Mn_{0.005}Nb_{0.995})O_3$ Thin Film, J. Am. Ceram. Soc., Jan. 2013 vol. 96(1), 146-150.
Poosanaas, et al., "Influence of Sample Thickness on the Performance of Photostrictive Ceramics", J. Appl. Phys., Apr. 23, 1998, vol. 84(3), 1508-1512.
Qi, et al., Band-Gap Engineering Via Local Environment in Complex Oxides, Phys. Rev., Jun. 24, 2011, vol. B 83, 6 pgs.
Qin, et al., "High Efficiency Photovoltaics in Nanoscaled Ferroelectric Thin Films", Appl. Phys. Lett., Sep. 25, 2008, vol. 93, 4 pgs.
Reuter, et al., "First-Principles Atomistic Thermodynamics for Oxidation Catalysis: Surface Phase Diagrams and Catalytically Interesting Regions", Phys. Rev. Lett., Jan. 30, 2003, vol. 90, 4 pgs.
Srihari, et al., "Wide Band Gap Tunability of Bulk $Cd_{1-x}Ca_xO$", J. Appl. Phys., Jan. 6, 2011, vol. 109, 7 pgs.
Yang, et al., "Above-Bandgap Voltages from Ferroelectric Photovoltaic Devices", Nature Nanotechnol., Jan. 10, 2010 vol. 5, 143-147.
Yang, et al., "Photovoltaic Effects in $BiFeO_3$", Appl. Phys. Lett., Aug. 14, 2009, 95(6), 3 pgs.
Young, et al., "Dirac Semimetal in Three Dimensions", Feb. 20, 2012, 7 pgs.
Young, et al., "First-Principles Calculation of the Bulk Photovoltaic Effect in Bismuth Ferrite", Dec. 7, 2012, 5 pgs.
Young, et al., First principles Calculation of the Shift current photovoltaic effect in Ferroelectrics. Phys. Rev. Lett., Sep. 14, 2012, vol. 109, 5 pgs.
Zhang, et al., "New High Tc Multiferroics $KBiFe_2O_5$ with Narrow Band Gap and Promising Photovoltaic Effect" Sci. Rep., Feb. 12, 2013, vol. 3, 1265.
Zhao, et al., "Zr-Modified $Pb(Mg_{1/3}Nb_{2/3})O_3$ with a Long-Range Cation Order", J. Am. Ceram. Soc., Jul. 14, 2008, vol. 91, 3031-3038.

* cited by examiner

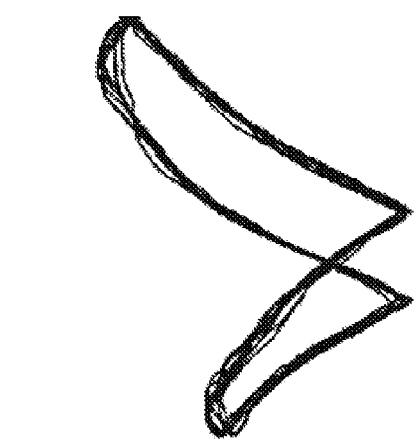
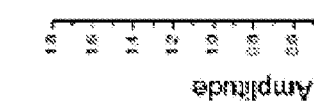
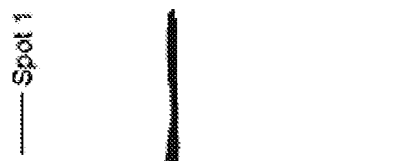
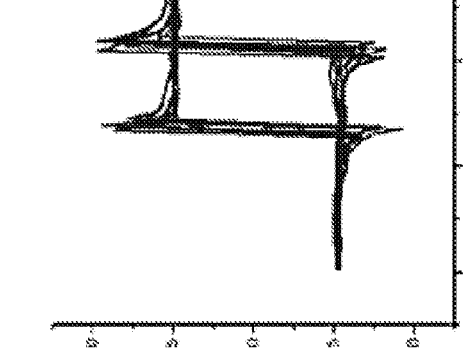
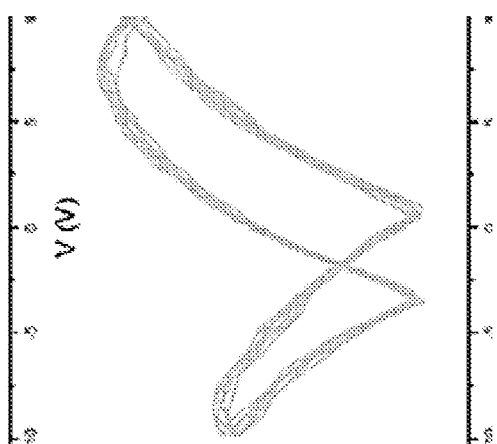
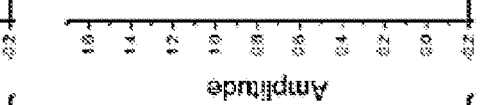
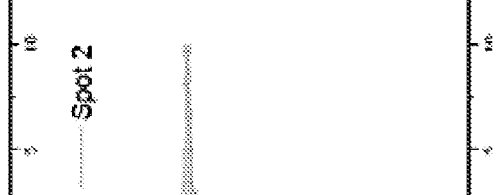
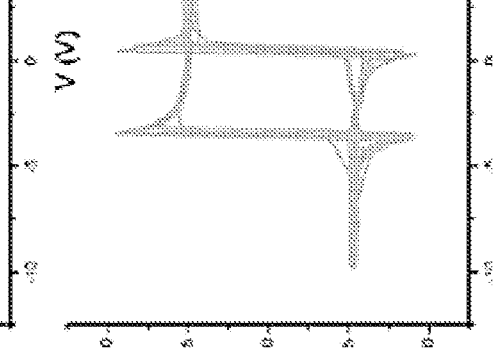
FIG. 4A    FIG. 4B    FIG. 4C    FIG. 4D

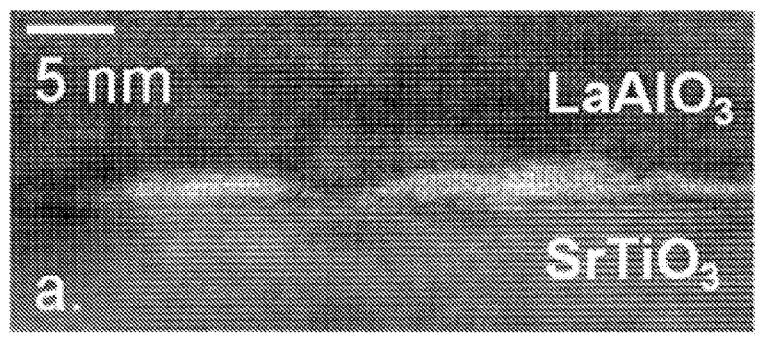
FIG. 15A
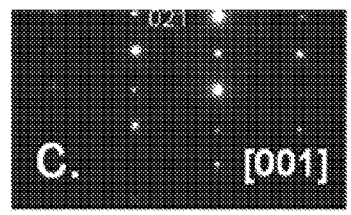
FIG. 15B  FIG. 15C

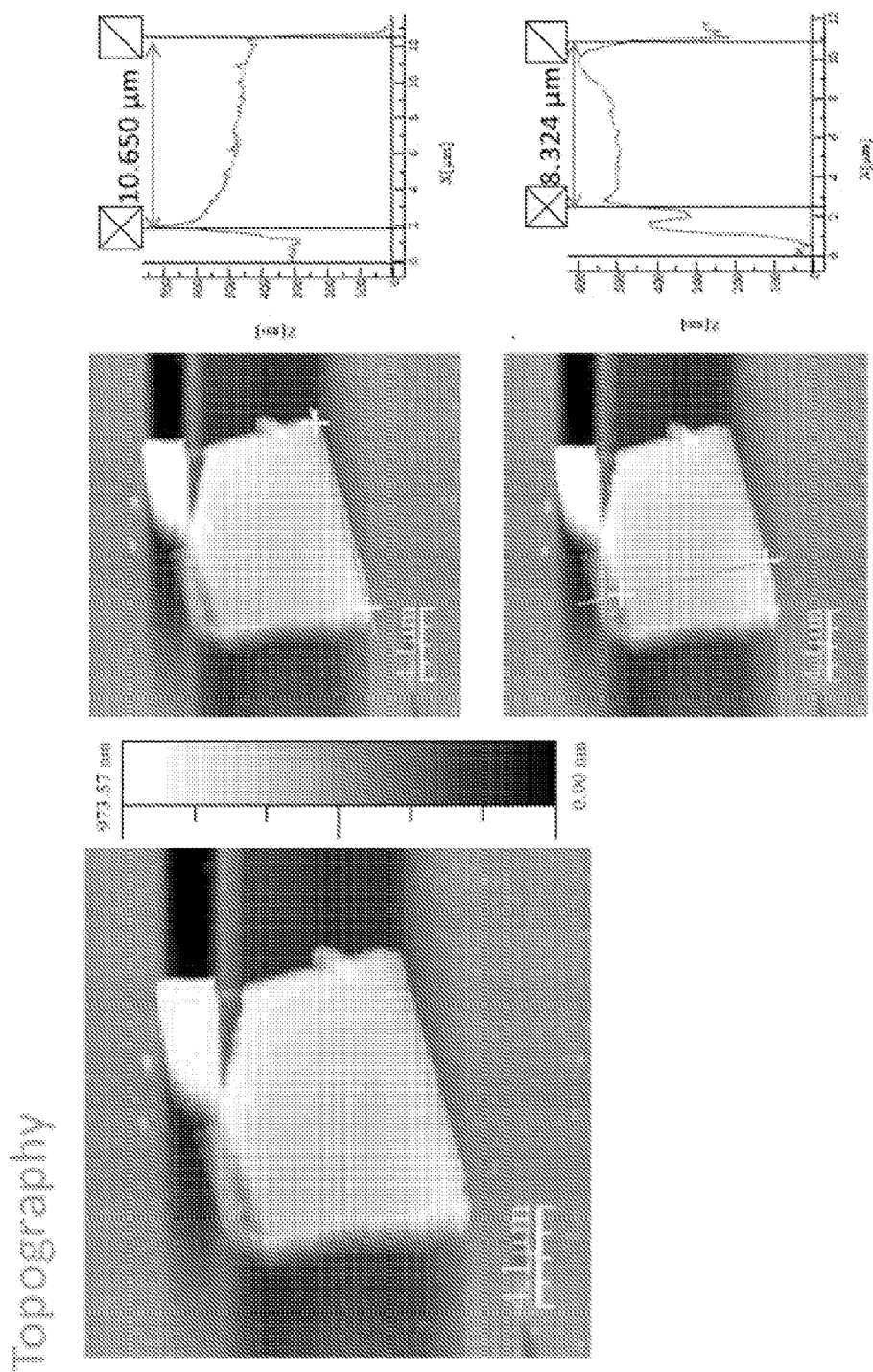

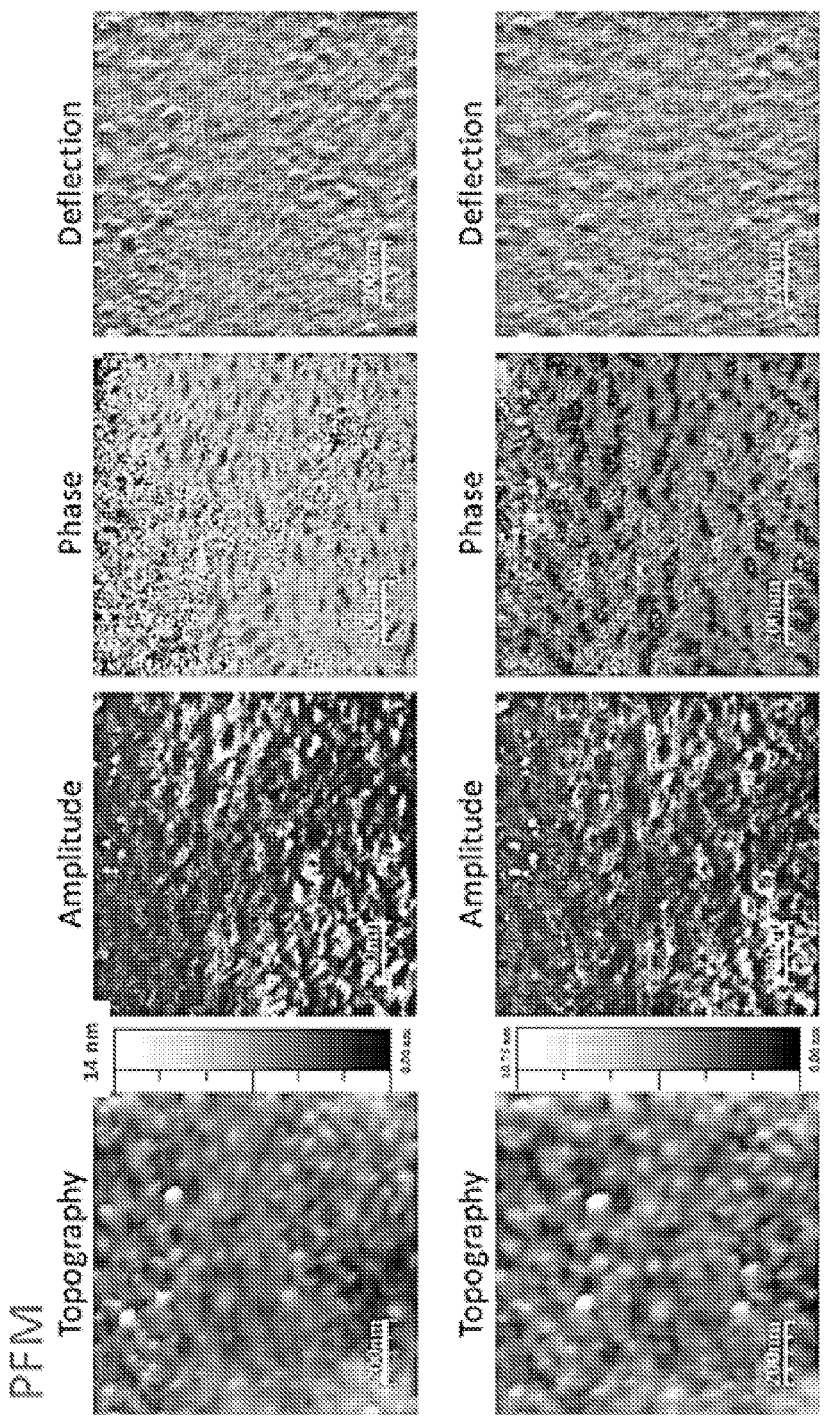

FIG. 21A
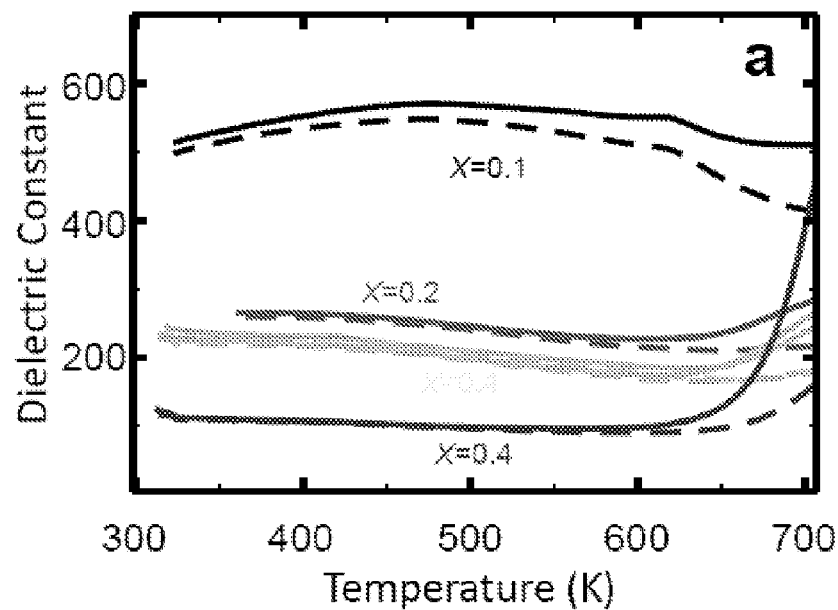
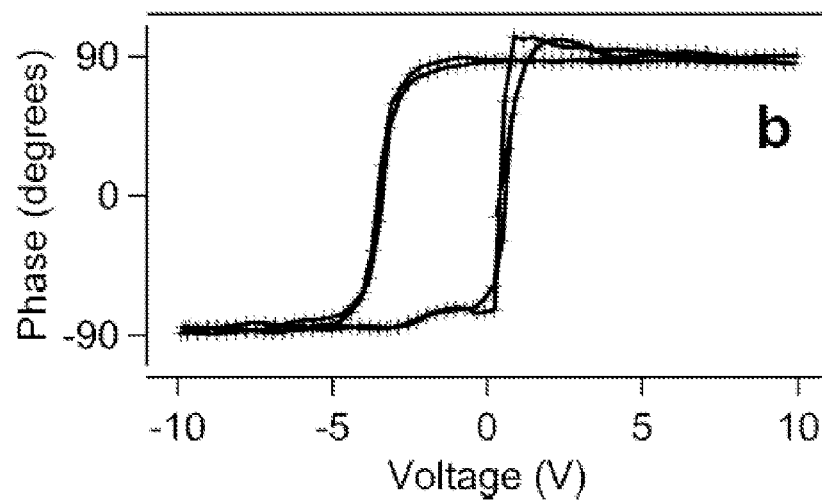
FIG. 21B

FIG. 22A
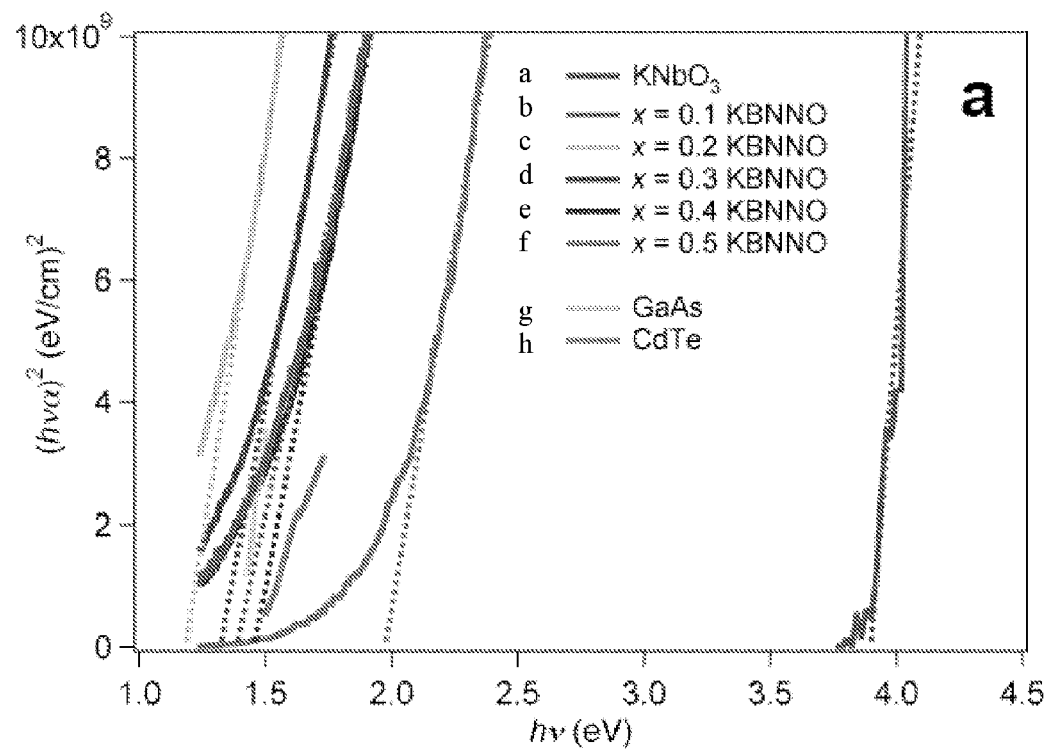
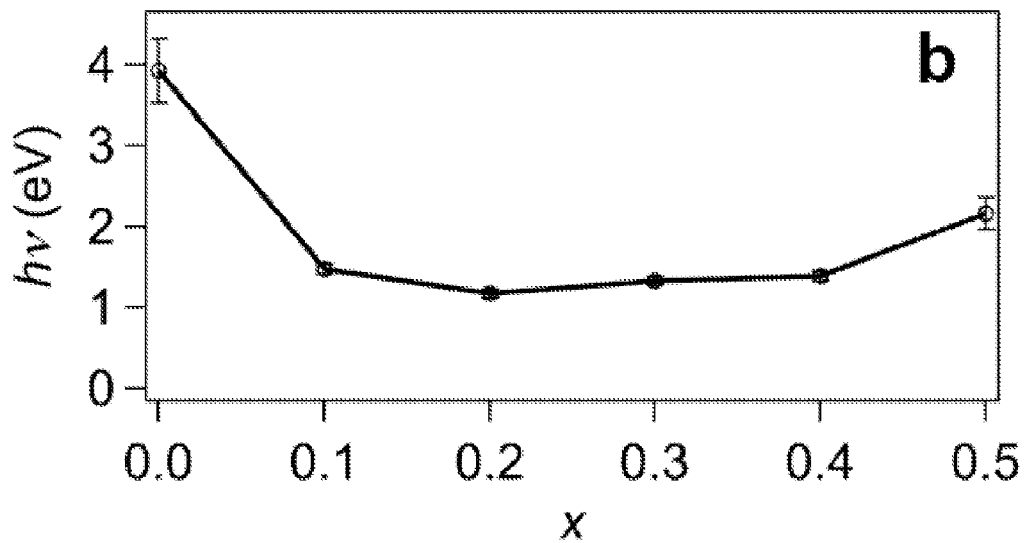
FIG. 22B

SEMICONDUCTOR FERROELECTRIC COMPOSITIONS AND THEIR USE IN PHOTOVOLTAIC DEVICES

RELATED APPLICATION

The present application claims priority to U.S. patent application 61/545,932, Semiconductor Ferroelectrics for Robust and Efficient Oxide Photovoltaics, filed Oct. 11, 2011, the entirety of which application is incorporated herein by reference for all purposes.

STATEMENT OF GOVERNMENT SUPPORT

The inventions disclosed herein were made using financial support from the following U.S. Federal Grants: U.S. Department of Energy (DE-FG02-07ER46431), U.S. Office of Naval Research (N00014-09-1-0157), U.S. Army Research Office (W911-NF-08-1-0067), and NSF Division of Materials Research (DMR 0907381).

TECHNICAL FIELD

The disclosed inventions are in the field of semiconductor oxide materials. The disclosed inventions are also in the field of ferroelectric perovskite materials. The disclosed inventions are also in the field of photovoltaic devices.

BACKGROUND

Solar energy is the most promising source of renewable, clean energy to replace the current reliance on fossil fuels. To make solar energy viable, inexpensive materials that efficiently convert solar radiation into electricity must be developed. Ferroelectric (FE) materials have recently attracted increased attention as a candidate class of materials for use in photovoltaic devices. Their strong inversion symmetry breaking due to spontaneous polarization allows for excited carrier separation by the bulk of the material and voltages higher than the band gap due to the anomalous bulk photovoltaic effect. However, the common $ABO_3$ perovskite FE exhibit poor carrier mobilities and wide band gaps. While a thin film configuration can dramatically increase the current harvested from the FE absorber material, the wide band gap ($E_{gap}$=3-4 eV) allows the use of only 8 percent of the solar spectrum, drastically reducing the upper limit of photovoltaic efficiency. (FIG. 1)

The wide band gap of these materials is due to the fundamental characteristics of bonding in FE perovskites. The excitation across the band gap is essentially a charge transfer from the O 2p states at the valence band maximum (VBM) to the transition metal d states at the conduction band minimum (CBM). Due to a large electronegativity difference between the O and transition metal atoms, the band gap is quite large. However, it is the presence of the transition metal cations in the $O_6$ cage that gives rise to ferroelectricity. Until now, the lowest known $E_{gap}$ for a FE perovskite has been 2.5 eV for $BiFeO_3$ (BFO). This made BFO a subject of a number of investigations for photovoltaic applications, with promising results. However, even BFO is capable of absorbing only 20% of the solar spectrum. Thus, a new approach is necessary to circumvent the fundamental limitation on the $E_{gap}$ in FE perovskites. Accordingly, new materials are needed to be discovered and/or designed to accomplish these goals.

SUMMARY

The present invention provides ferroelectric perovskites characterized as having a band gap, $E_{gap}$, of less than 2.5 eV.

The present invention also provides compounds comprising a solid solution of $KNbO_3$ and $BaNi_{1/2}Nb_{1/2}O_{3-\delta}$, wherein $\delta$ is in the range of from 0 to about 1.

The present invention further provides photovoltaic devices comprising one or more solar absorbing layers, wherein at least one of the solar absorbing layers comprises a semiconducting ferroelectric layer.

The present invention also provides solar cell, comprising: a heterojunction of n- and p-type semiconductors characterized as comprising an interface layer disposed between the n- and p-type semiconductors, the interface layer comprising a semiconducting ferroelectric absorber layer capable of enhancing light absorption and carrier separation.

The present invention also provides compounds, ferroelectric perovskites, photovoltaic devices and solar cells comprising a solid solution of oxides comprising Ba, Nb, one or more of K and Na, and one or more of Ni, Pd and Pt.

The present invention also provides a heterojunction comprising materials that provide a Type II interface, i.e. that which has band offsets that provide a potential landscape to separate carriers. Suitable Type II interfaces include, for example, a bi-polar n-p junction, a solar cell comprising a heterojunction consisting of n+-n, p-p+, or other combinations of materials. Accordingly, the present invention also encompasses bi-polar homojunctions, typically characterized by an abrupt or gradual gradient in composition of the complex oxide ferroelectric within the solar cell achieving doping provides the same result without additional materials.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIG. 15 depicts cross-section image demonstrating hetero-epitaxial $LaAlO_3$ on $SrTiO_3$ and coherency of atomic planes obtained by ALD of alternating binary oxides to demonstrate that high-quality interfaces can be obtained by this method. Also shown are Fourier-transform and converging beam electron diffraction pattern collected from the interfacial region.

FIG. 21 depicts (a) Dielectric constant as a function of temperature for the KBNNO materials with x=0.1, 0.2, 0.3 and 0.4 BNNO fraction for 100 kHz (solid) and 1 MHz (dashed). For x=0.3 and x=0.4 there are no dielectric anomalies. For x=0.2 there is a weak anomaly at ≈400K. For x=0.1, there are two anomalies at ≈450K and ≈600K, indicating that this composition is ferroelectric. (b) Local ferroelectric piezoelectric hysteresis loop measured for an x=0.1 lamella sample of KBNNO. The square loops exhibited by the sample show that KBNNO is ferroelectric at room temperature.

FIG. 22 depicts (a) ellipsometry results determine the band gap for KBNNO oxides with x=0.1-0.5. The samples have band gaps from 1.18 eV to 1.97 eV, making them promising for solar light absorption. (b) Band gap values versus BNNO fraction.

DETAILED DESCRIPTION OF ILLUSTRATIVE EMBODIMENTS

Figure 1:
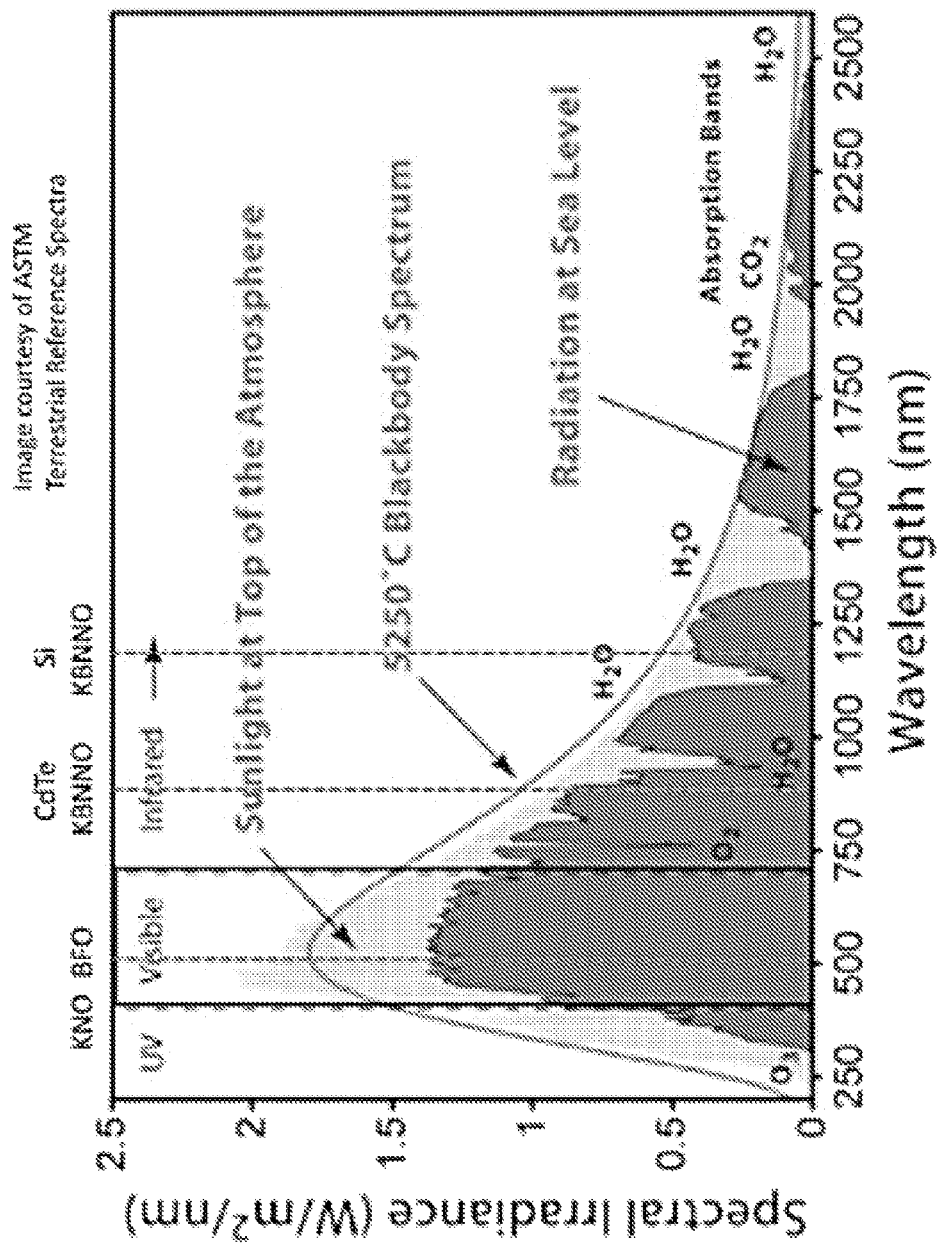
FIG. 1 depicts spectral irradiance versus wavelength.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it can be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

More solar energy reaches the earth in one hour than is needed to meet global energy demand for an entire year. Solar cells convert sunlight to electricity cleanly and renewably, and can be implemented in geographically diverse areas, including off-grid. Crystalline silicon has long been the most widely used photovoltaic material, exhibiting cell efficiencies of 25%, but the cost of electricity from c-Si solar cells is approximately four times larger than that of electricity produced from fossil fuels. Thin film CdTe and $CuIn_xGa_{1-x}Se_2$ (CIGS) photovoltaics offer lower cost than c-Si but use rare, expensive, or toxic elements; CIGS also has problems with robustness and mass production. The dye-sensitized solar cell (DSSC), or Grätzel cell, has shown great promise, both in terms of high efficiency and low materials and embodied energy costs. The innovative architecture of the DSSC uses a mesostructured wide band gap semiconductor whose large surface area is sensitized with a molecular dye, and whose pores are infiltrated by an electrolyte. This architecture separates the functions of light absorption and electron and hole transport into three separate materials, and it ensures efficient charge separation by absorbing all photons precisely at the nanostructured interface. However, use of organometallic dye molecules, corrosive $I^-/I_3^-$ redox couples, and volatile electrolytes has led to significant criticism that DSSCs are not robust enough for widespread deployment.

Continuing the growth of photovoltaics for energy generation can require drastically reducing cost while maintaining or improving efficiency. This necessitates the development of inexpensive, clean, robust, and efficient solar cells using cheap, non-toxic, earth-abundant materials. Ferroelectric oxides have recently attracted a lot of attention for use as FE absorbers in photovoltaics. Under unpolarized illumination, these materials generate intrinsic photocurrents due to their lack of inversion symmetry; this is known as the bulk photovoltaic effect (BPVE). Traditionally, photovoltaic materials are heterogeneous, doped structures, relying on the electric field at a p/n junction to separate photoexcited electrons and holes. By contrast, the bulk photovoltaic effect can be observed even in pure homogeneous samples.

Bulk and thin-film ferroelectric $BiFeO_3$ can be used as FE absorbers in photovoltaics, but current densities have been very low for two reasons. First, the band gap of $BiFeO_3$ is 2.5 eV, much larger than optimal for photovoltaics. Second, low mobilities inherent in FE oxides lead to short carrier collection lengths in planar cells. The incorporation of new FE oxide materials into a novel solar cell architecture can circumvent these two problems and yield a robust, inexpensive, and efficient solar cell.

Accordingly, the present invention provides ferroelectric perovskites and compounds characterized as having a band gap, $E_{gap}$, of less than 2.5 eV. Particularly suitable ferroelectric perovskites can also have band gap less than about 2.0 eV, or even from about 1.1 eV to about 1.6 eV. Suitable ferroelectric perovskites comprise a solid solution of $KNbO_3$ and $BaNi_{1/2}Nb_{1/2}O_{3-\delta}$, wherein $\delta$ is in the range of from 0 to about 1. More generally, the solid solution of $KNbO_3$ and $BaNi_{1/2}Nb_{1/2}O_{3-\delta}$ is represented as $(1-x)KNbO_{3-x}BaNi_{1/2}Nb_{1/2}O_{3-\delta}$ (KBNNO), wherein x is in the range of from about 0.01 to about 0.99. An equivalent representation of this formula is $[KNbO_3]_{(1-x)}[BaNi_{1/2}Nb_{1/2}O_{3-\delta}]_x$. In other embodiments x is in the range of from about 0.1 to about 0.5, and is most preferably about 0.1. As well, suitable ferroelectric perovskites can have $\delta$ is in the range of from about 0.2 to about 0.3. Suitable ferroelectric perovskites will also be characterized as ferroelectric up to at least 100 degrees C., especially for use as materials in photovoltaic cells. The perovskite structure is readily characterized using X-ray diffraction.

In certain embodiments atomic substitution can be made. For example, K atoms can be replaced by Na atoms in the structures described herein. Likewise Ni atoms can be replaced by Pd or Pt atoms. Hence, the present invention further provides for solid solutions of oxides comprising Ba, Nb, one or more of K and Na, and one or more of Ni, Pd and Pt. In this regard the solid solution of oxides, as more broadly described here are can also be characterized as being ferroelectric perovskites, which can be fabricated using the methods described herein to prepare photovoltaic devices and solar cells.

Photovoltaic devices comprising one or more solar absorbing layers, wherein at least one of the solar absorbing layers comprises a semiconducting ferroelectric layer are also provided. The photovoltaic devices comprise a semiconducting ferroelectric layer that is characterized as having a band gap in the range of from about 1 to 2 eV. Certain preferred photovoltaic devices comprise a semiconducting ferroelectric layer being characterized as having a band gap in the range of from about 1.1 to 1.5 eV. As described herein, the semiconducting ferroelectric layer can comprise a solid solution of $KNbO_3$ and $BaNi_{1/2}Nb_{1/2}O_{3-\delta}$, wherein $\delta$ is typically in the range of from 0 to about 1. Suitable solid solutions of $KNbO_3$ and $BaNi_{1/2}Nb_{1/2}O_{3-\delta}$ can be represented as $(1-x)KNbO_{3-x}BaNi_{1/2}Nb_{1/2}O_{3-\delta}$ (KBNNO), wherein x is in the range of from about 0.01 to about 0.99. In certain preferred embodiments x is in the range of from about 0.1 to about 0.5. In other embodiments, it is also preferred that $\delta$ is in the range of from about 0.2 to about 0.3.

Solar cells according to the present invention include a heterojunction of n- and p-type semiconductors. The heterojunction is characterized as comprising an interface layer disposed between the n- and p-type semiconductors, the interface layer comprising a semiconducting ferroelectric absorber layer capable of enhancing light absorption and carrier separation. Suitable heterojunctions of n- and p-type semiconductors can be further characterized as being nanostructured, such as described further herein and in the examples below Suitable solar cells will typically include a back contact in electrical communication with the p-type semiconductor, a blocking layer in electrical communication with the n-type semiconductor, and a front contact in electrical communication with the blocking layer. Accordingly, light radiation incident upon the front contact gives rise to an electric load between the back contact and the front contact.

The present invention also provides a heterojunction comprising materials that provide a Type II interface, i.e. that which has band offsets that provide a potential landscape to separate carriers. Suitable Type II interfaces include, for example, a bi-polar n-p junction, a solar cell comprising a heterojunction consisting of n+-n, p-p+, or other combinations of materials. Accordingly, the present invention also encompasses bi-polar homojunctions, typically characterized by an abrupt or gradual gradient in composition of the complex oxide ferroelectric within the solar cell achieving doping provides the same result without additional materials.

The solar cells described herein can have a ferroelectric absorber layer comprising a perovskite material. Suitable perovskite materials may include a semiconducting ferroelectric layer, one example being a solid solution of $KNbO_3$ and $BaNi_{1/2}Nb_{1/2}O_{3-\delta}$, wherein $\delta$ is in the range of from 0 to about 1. In certain preferred solar cell embodiments, $\delta$ can be in the range of from about 0.2 to about 0.3.

Figure 5:
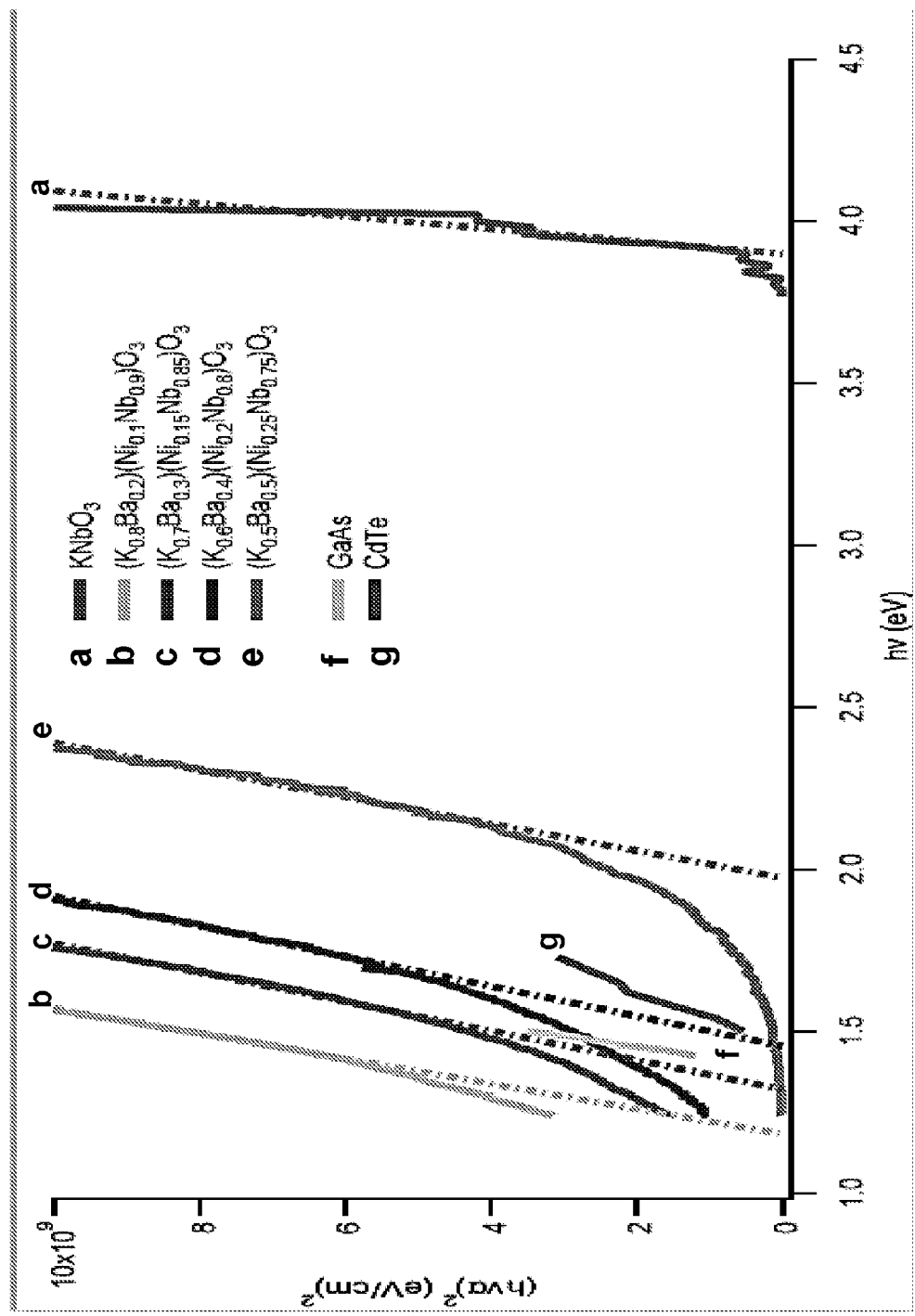
FIG. 5 provides the light absorption properties of different compounds of the present invention using spectroscopic ellipsometry as well as for GaAs and CdTe.

Materials: a key innovation is the use of symmetry-breaking polar oxides with moderate band gaps to absorb light and efficiently separate photoexcited charges. Perovskite-structure ($ABO_3$) polar oxides have not previously been considered strong candidates for photovoltaic applications, because of their wide band gaps and low mobilities. However we have designed, synthesized and characterized a series of $[KNbO_3]_{1-x}$-$[BaNi_{1/x}Nb_{1/2}O_{3-\delta}]_x$ (KBNNO) solid solutions. These materials are polar, have band gaps in the 1.1-2.0 eV range, FIG. 5, and show an order of magnitude photocurrent enhancement relative to the well-known FE parent $KNbO_3$ material. These results indicate that a new class of materials, semiconducting FEs, can now be considered as solar absorber layers in photovoltaics. The available band gaps span the 1.1-1.5 eV range that is optimal for high-efficiency single junction solar cells. The KBNNO materials can increase efficiency relative to $BiFeO_3$, by enabling conversion of green/yellow/red/near-IR photons in addition to blue. The polar character of the FE oxide also enables mechanisms of charge separation that are entirely different from those in solar cells based on p-n junctions.[2] These materials are stable and abundant oxides: oxides are robust with respect to changes in environment, their elemental abundances enable inexpensive cells, and modern oxide growth techniques pave the way for scalable integration of components. Therefore, the proposed oxide-based solar cells have the potential to be cheaper than c-Si solar cells and much more robust than DSSC or organic solar cells.

Figure 12:
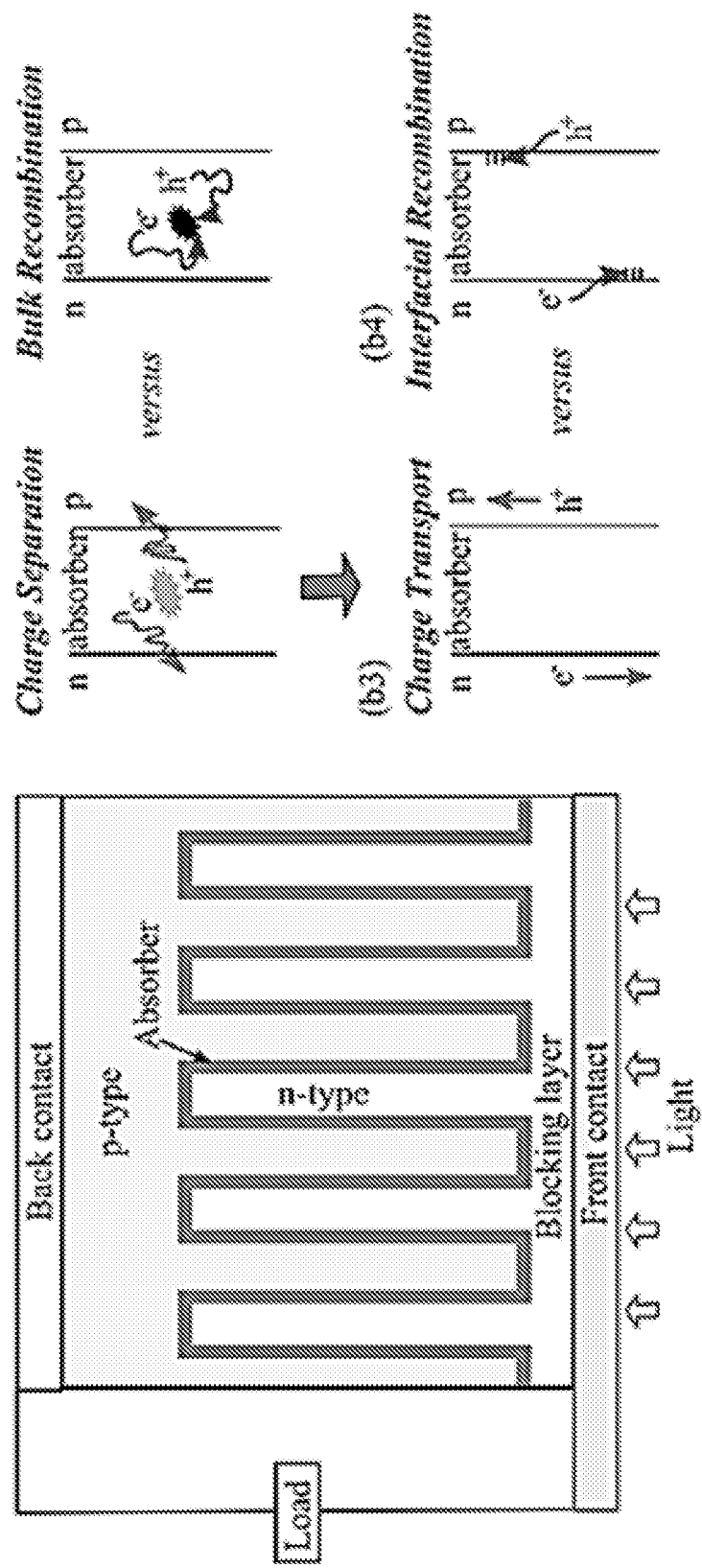
FIG. 12 depicts a nanostructured solar cell comprising compounds of the present invention; interpenetrating networks of n- and p-type semi-conductors form a large-area heterojunction; a semiconducting FE absorber layer at the n-p interface enhances light absorption and carrier separation.
Figure 13A:
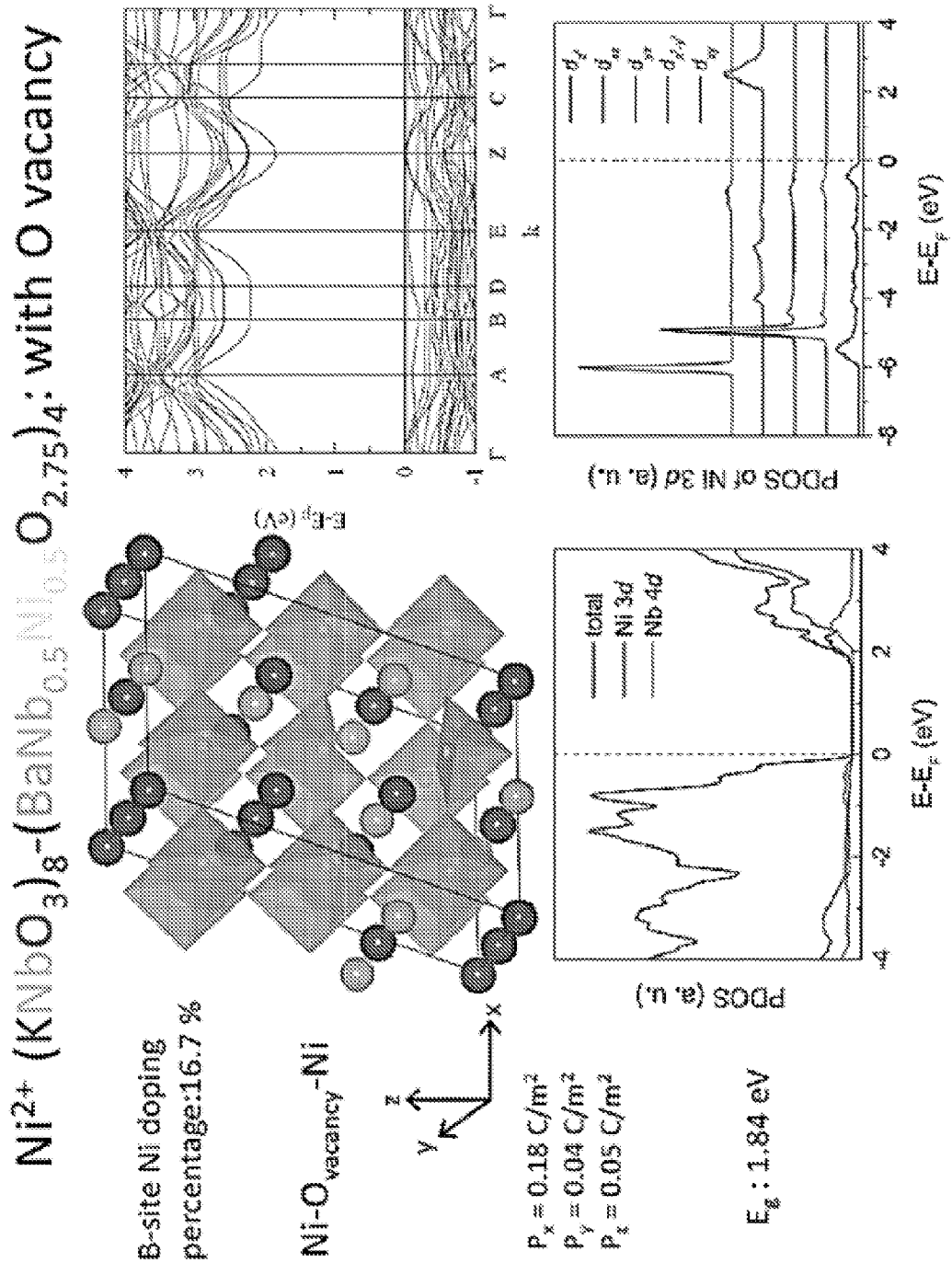
FIGS. 13A-D depict various calculated properties of the KBNNO embodiment of the present invention.
Figure 13B:
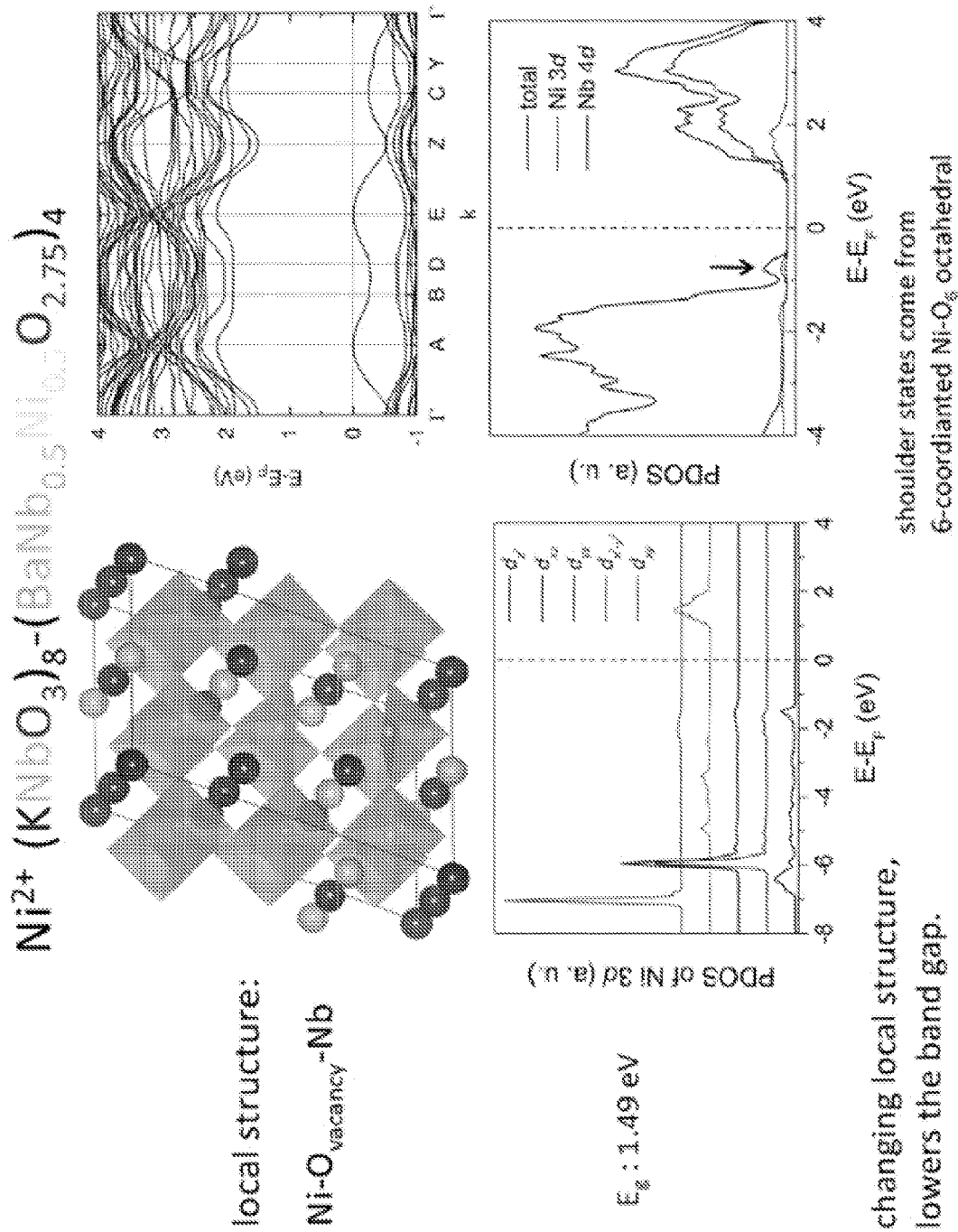
Figure 13C:
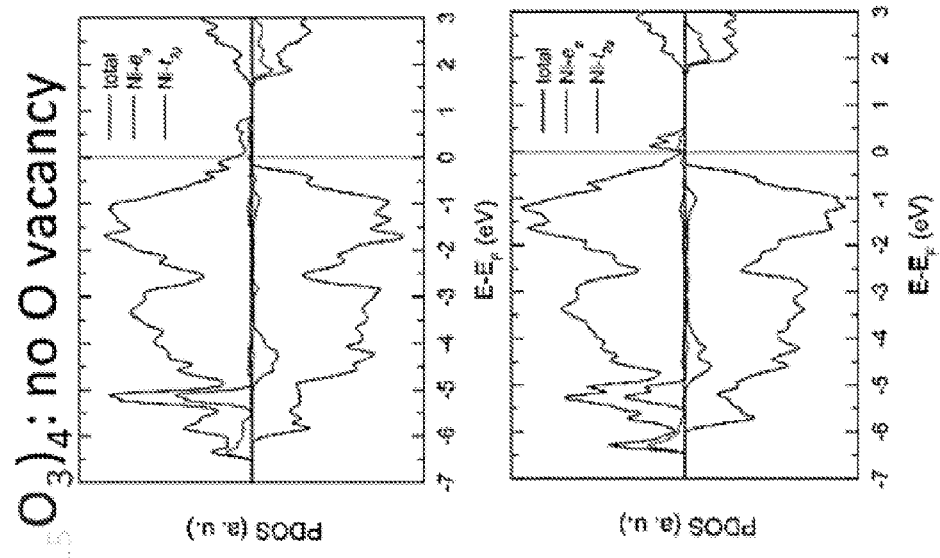
Figure 13C:
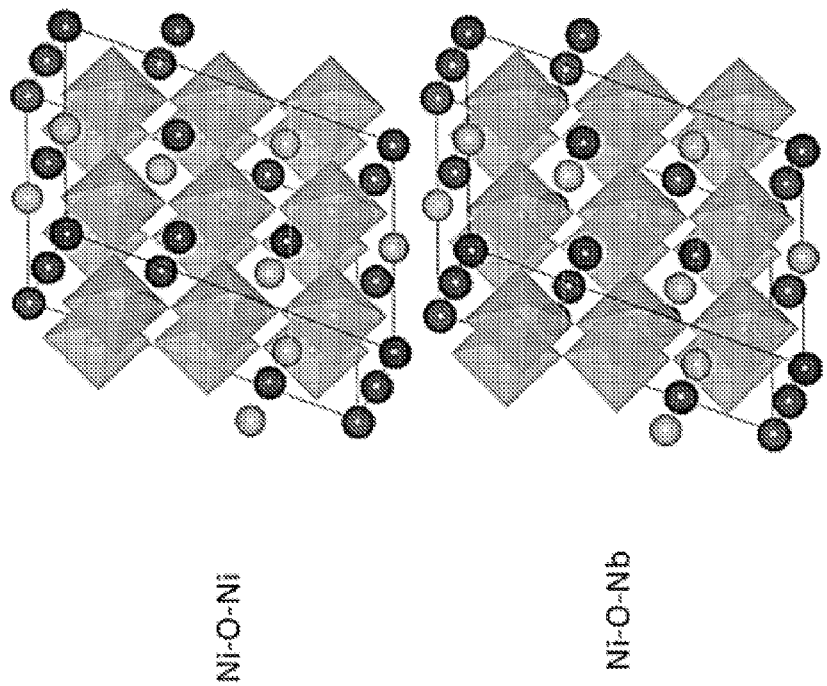
Figure 13D:
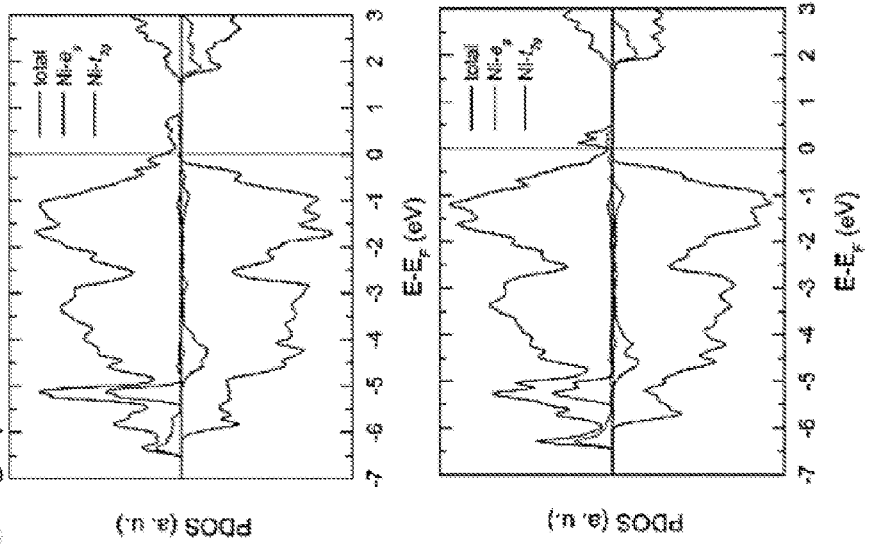
Figure 13D:
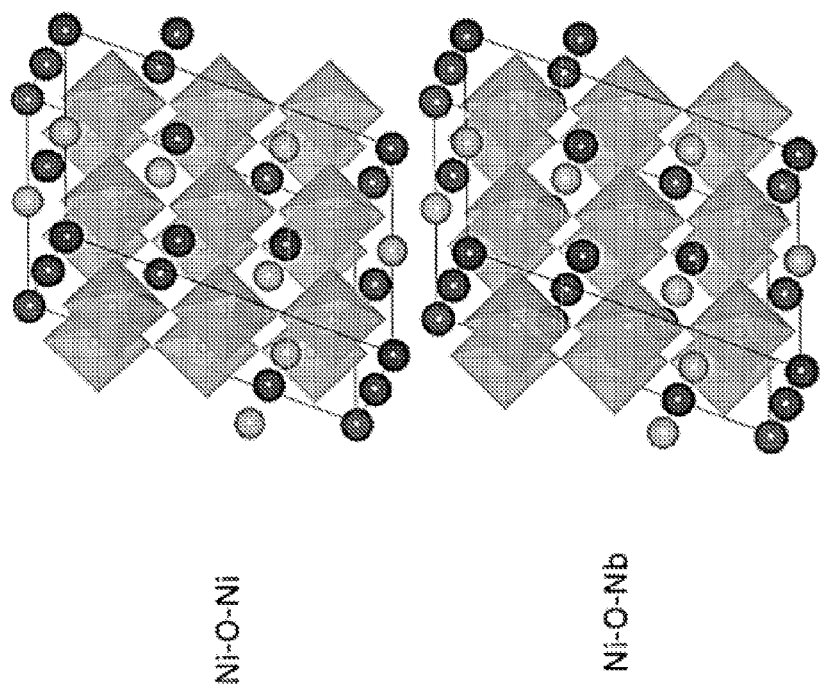
Figure 14:
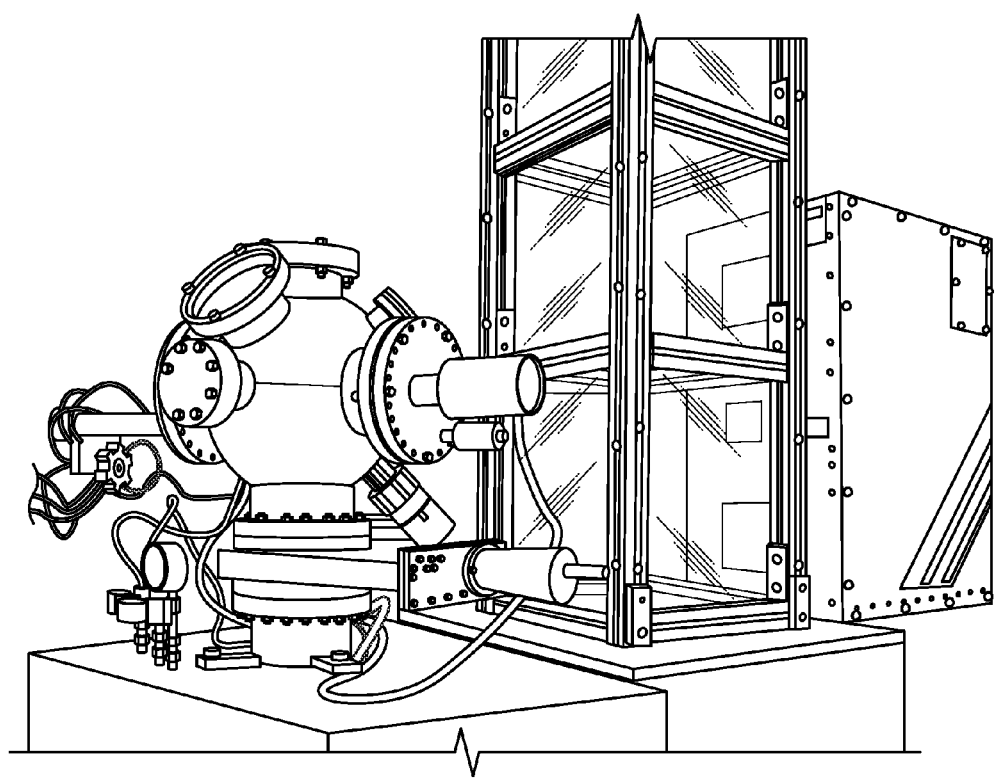
FIG. 14: High-vacuum PLD system possessing a 3-target manipulator (left rear).

Architecture: We can address the problem of low carrier mobility in oxides through the use of an extremely thin absorber (ETA) solar cell design. Planar devices cannot efficiently convert photons to electrons if the optical absorption depth is much larger than the carrier collection length. The ETA cell structure consists of a high surface area, mesoporous n-type semiconductor coated with a thin (≈20 nm) absorber layer, with interstices filled with a p-type semiconductor to create an interpenetrating hetero-junction, as shown in FIG. 12. Light is absorbed by the absorber layer, generating an electron and hole that must be separated laterally across the n- and p-type interfaces, respectively, without recombining in the bulk material. Large surface area enables thinner absorber films to absorb the same amount of light as thick planar films, but the thin absorber leads to quantitative charge separation. Poled FE absorbers are expected to enhance charge separation and photovoltage compared to typical semiconductors. After separation, charges must be transported in the n- and p-type layers to opposite contacts, without recombining interfacially, in order to produce electrical current. The polarization of the FE absorber may even eliminate the need for p- and n-type contacts altogether, if ohmic contacts can be made to metals or transparent conductors.

Preliminary Results: As a result of a multi-PI, interdisciplinary research effort, the absorber material exists in bulk form and exhibits the necessary properties to form the core of the proposed solar cell.

Initial calculations can be used to engineer the band gaps of polar oxides such as $PbTiO_3$ through the substitution $Ni^{2+}$ and oxygen vacancies. Accordingly $Pb(Ti_{1-x}Ni_x)O_{3-x}$ solid solutions can be prepared, in which the solubility of $Ni^{2+}$ in this titanate is constrained by an apparent instability of the host $Ti^{4+}$ cations in the lower coordination environment that accompanies the formation of oxygen vacancies. While a reduced coordination of $Ti^{4+}$ in a perovskite is rare, this limitation does not apply to many niobates, where the accommodation of oxygen non-stoichiometry reflects a stability of the $Nb^{5+}$ cation in reduced coordination. Building on these crystal chemical guidelines, once can experimentally determine the substitution of $Ni^{2+}$ and oxygen vacancies into the FE $KNbO_3$ system. Using $Ba(Ni_{1/2}Nb_{1/2})O_{2.75}$ as the nickel-based, oxygen-vacancy end-member, single-phase solid solutions were stabilized in the $[KNbO_3]_{1-x}$-$[Ba(Ni_{1/2}Nb_{1/2})O_{2.75}]_x$ (KBNNO) system with x values as high as 0.5 (see FIG. 5). X-ray diffraction patterns collected from samples with x≤0.2 showed clear evidence for the stabilization of a tetragonally-distorted structure, and measurements of their dielectric response revealed Curie-type maxima in their permittivity. Density functional theory (DFT) calculations of the electronic structure of KBNNO (FIG. 13 $ABO_3$ picture and DFT band structure) indicated that the response of $KNbO_3$ to the incorporation of $Ni^{2+}$ and vacancies was similar to that predicted for $PbTiO_3$. We validated this prediction by showing that the KBNNO compositions are polar, have band gaps in the 1.1-2.0 eV (FIG. 5) range and induce an order of magnitude enhancement in photocurrent relative to the FE parent $KNbO_3$ material. We now propose to take the next step and incorporate these materials as solar absorber thin films in functioning photovoltaic cells.

Embodiment—Robust, Inexpensive, and Efficient Solar Cells Based on Nanostructured Oxides: An oxide-based solar cell whose nanostructured architecture draws on the strengths of the DSSC, but is entirely constructed of earth-abundant, non-toxic, robust materials is provided. Such a solar cell possesses significantly reduced embodied energy and can be produced at lower cost and with reduced ecological impact compared with cells comprised of elemental or binary semiconducting (e.g. II-VI or III-V) materials. The inorganic oxide materials are also more stable and robust than DSSCs, leading to longer lifetimes and increased usage in harsh environments. The architecture of this cell consists of an array of n-type oxide nanowires (e.g. ZnO or $ABO_3$), coated with an extremely thin (≈10 nm) absorber (ETA) layer of KBNNO semiconducting FE oxide or other low-band gap FE oxide, and filled by a wide band gap hole conductor.

The use of FE oxides for light absorption and charge separation is the central new feature of this design. Without being bound by any limiting theory, we believe that semiconducting FE oxides can play an increasingly significant role in solar energy harvesting, charge separation, and energy transfer due to their low cost and ability to separate electrons and holes efficiently. While FE oxides have been considered and investigated for photocatalysis and photovoltaics, their large band gaps and low electronic carrier mobilities have limited their applicability. Furthermore, the prevailing view has been that the depolarizing field of FEs would limit their application in nanoscale devices, since reduction of the FE thickness below ≈100 nm is typically accompanied by a dramatic reduction of the FE polarization.

In the solar cell depicted in (FIG. 12), the nanostructured interface where light is absorbed and charges are separated in the DSSC design can be replaced by one or more thin conformal coatings of high-quality, semiconducting FE oxide. Unique and technologically relevant features of the semiconducting FE—its electrostatic potential landscape owing to the FE polarization and orientation, and its diode-like polarization-dependent optical response—can be leveraged to absorb visible light, facilitate charge separation and reduce interfacial recombination within a single material. KBNNO can be used as the absorber material, we can adjust the absorber composition as need be to achieve more scalable synthesis, higher quality interfaces and greater carrier mobility. The design of the new all or nearly all-oxide cell materials and configurations is supported by proximal probe, mesoscopic, and ensemble characterizations as discussed below.

The use of FE oxide coatings increases solar cell efficiency compared to DSSCs and other nanostructured solar cells while maintaining low fabrication costs. Materials are earth abundant and can be processed under relatively benign conditions.

Fabrication of FE Absorber Thin Films. The selection of a chemically-designed semiconducting FE oxide layer and its incorporation in nanostructured solar cells satisfies a number of requirements in addition to having a band gap in the visible and a configuration that can orient the FE polarization. The deposition process is capable of producing materials with precise chemical control, thickness, and even surface chemical termination. The processing results in high-quality material interfaces (ideally epitaxial) with conformal coatings on n-type ZnO nanowires or alternately, $TiO_2$ or $ABO_3$ nanostructures.

Thin-film deposition processes can be rapidly optimized and adapted to producing conformal, ultra-thin coatings on arrayed and porous nanostructures. To achieve scalability and precise control of thickness, composition, and crystalline quality, two thin-film preparation routes that have been successful in producing high-quality films and nanostructured coatings can be used: pulsed laser deposition (PLD) and atomic layer deposition (ALD). PLD can be used to obtain heteroepitaxial complex oxide growth on binary oxide (MgO) nanowires. However, such growth requires relatively large separation between nanowires, controlling the shell thickness obtained via PLD remains challenging, and PLD is considered to be of limited scalability for high-volume, low-cost production. ALD is an effective method for producing highly conformal binary oxides, other inorganic materials, and FE and related oxide perovskite films in planar form (e.g. $PbTiO_3$, $Pb(Zr_{1-x}Ti_x)O_3$, $SrTiO_3$), with the potential for high scalability.

KBNNO thin films can be grown at several compositions. The absorber composition may, in some embodiments, be modified such as by including semiconducting FE oxides. Planar semiconducting FE oxide perovskite films can be deposited on conducting perovskite and binary oxide substrates via PLD from bulk targets using solid-state chemical routes. ALD processes can be used for depositing KNO and KBNNO planar films via ALD using metallorganic precursors. Precursors potassium isopropoxide and potassium 2,4-pentadionate, hydrate; barium bis(2,2,6,6-tetramethyl-3,5-heptanodionate) hydrate "$Ba(thd)_2$"; bis(cyclopentadienyl) nickel(II), nickel (II) 2,4-pentanedionate; bis(cyclopentadienyl) niobium (IV), niobium(V) n-butoxide, and niobium (V) ethoxide can be used, and may benefit from the versatility of the liquid injection approach discussed below.

PLD is one of the most common methods of obtaining complex oxide perovskite thin films of high quality, including KNO. Translation of the bulk synthesis of KBNNO from pellet form to a thin film process presents significant challenges. Systematic careful variations of the base vacuum and oxygen partial pressure, the substrate temperature, and the laser fluence/pulse energy can be used to obtain the target oxygen stoichiometry of the KBNNO phase, especially considering the multi-valent state of $Ni^{2+}$ and $Ni^{3+}$ that has been observed in recent XPS characterizations of the bulk KBNNO material. In addition, conditions can be optimized to permit heteroepitaxial growth of KBNNO on conductive perovskite oxide and other oxide substrates, permitting optical and scanned-probe characterization of these interfaces to assess suitability for solar cell prototype devices.

ALD of perovskite oxides is far less common and more challenging than ALD of metals or binary oxides, since it typically involves either a metalorganic precursor with multiple metals or the sequential deposition of multiple single-metal metalorganic precursors, resulting in the deposition of an amorphous film that requires subsequent annealing in oxygen. Precursor selection for use in an ALD temperature window is complicated by the dearth of high-volatility metalorganic precursors. Recently however, Spanier and collaborators demonstrated that heteroepitaxial $LaAlO_3$ films possessing atomic planes coherent with substrate $SrTiO_3$ can be obtained via ALD of amorphous and alternating bilayers of $La_2O_3$ and $Al_2O_3$ films using tris(isopropylcyclopentadienyl)lanthanum and trimethyl aluminum onto $TiO_2$-terminated $SrTiO_3$ and subsequent annealing (FIG. 15). Optimization of pre- and post-anneal stoichiometry with the aid of Rutherford backscattering spectroscopy and X-ray fluorescence can be used to achieve the desired composition.

As an example configuration, a high-vacuum PLD system is constructed or provided, which system includes an excimer laser (KrF, 248 nm) configured for depositing complex perovskite oxides from single targets. The system also includes three-target automatically-indexed manipulator capabilities for sequenced deposition of other materials, including conductive perovskites (e.g. $SrRuO_3$, Nb:STO) ZnO (FIG. 15). Other configurations can also be achieved using other excimer wavelengths, or Nd:YAG or other lasers capable of pulsed UV radiation and ablation. In principle the target manipulator need not be a three-target indexed one, but the system typically includes capability for deposition in a reactive environment to enable optimization of O stoichiometry.

Poor volatility in precursors, particularly at the low temperatures required to avoid precursor decomposition in ALD, is a persistent challenge that can be addressed using an alternate precursor delivery mode. A commercial research-scale ALD reactor system is modified to include a liquid injection subsystem enabling a wide range of lower-volatility metalorganics for investigating candidate ALD precursors for obtaining the targeted complex oxide thin films, including $BiFeO_3$. Although ALD is not selected for its rapid growth rate, this liquid injection precursor delivery method can be considerably faster than waiting for the evaporation, or even $N_2$-assisted evaporation, of low vapor-pressure precursors.

The two proposed thin-film deposition approaches for obtaining complex oxide films and coatings are complementary. Since the starting material for PLD is the stoichiometrically correct pellet, we expect to be able to produce the desired KBNNO phase as an epitaxial film, through systematically-controlled variation of deposition parameters, post-deposition in situ or ex situ annealing (if necessary), and structural characterization. PLD also permits growth of other semiconducting FE complex oxide perovskite phases on conducting and oxide substrates with control of thickness, grain size, and orientation. While PLD has been employed to produce coatings of complex oxide perovskite materials on binary oxide nanowires, a highly scalable, low-cost and ecologically-friendly process for obtaining coatings with monolayer-control would be highly advantageous, hence the suitability of ALD.

Characterization of Multi-Component Oxide Layers. In addition to evaluation of deposited film uniformity and adhesion using scanning probes and scanning electron microscopy, the interfacial quality, e.g. the nature and concentration of defects that can act as trap states, microstructure, and crystallographic structure, can require characterization using high-resolution TEM and electron diffraction. Thin film products can also be analyzed using X-ray diffraction and compositional analysis using X-ray fluorescence and Rutherford backscattering.

Optical reflectivity, absorption, and spectroscopic ellipsometry of the deposited thin-film semiconducting FE oxide perovskites can be collected and analyzed to validate model calculations of dielectric function and electronic density of states. In order to optimize cell design and deposited material quality, electronic transport measurements in electrically-contacted films can be performed to evaluate carrier concentrations and Hall mobilities. $ABO_3$ nanostructures are prepared and used for proximal probing to evaluate their local FE properties, including co-axial nanostructures comprised of semiconducting cores and FE $ABO_3$ shells, similar to the nanostructures proposed herein. Electron beam induced current (EBIC) and scanned photocurrent can also be used to evaluate the local electronic landscape within intrinsic semiconducting nanowires with blocking contacts. Such local probes of films and nanostructures can be used to evaluate band bending, carrier recombination and diffusion lengths, and local polar character; these are increasingly important and common methods for spatially-resolved quality control of the absorber(s), the n-type and p-type conductors, and their interfaces.

Characterization of the FE polarization, coercive field and phase transition temperature can be carried out on thin films obtained by PLD and ALD. Local FE switching and hysteresis can be collected using a scanning probe microscope to measure coercive fields, and capacitance-voltage measurements can be used to quantify FE polarization. These measurements can be carried out both in the dark and under illumination by a scanning monochromatized supercontinuum source, to investigate the effect of local orientation of polarization and illumination wavelength on photocurrent. Individual co-axial cylindrical nanowires composed of ZnO cores and KBNNO and other material shells can be contacted electrically, with one contact placed on the core (following selective etching) and the other on the shell. FE polarization measured across individual nanowires has been reported, and extreme curvature can stabilize ferroelectricity in PZT in few-nm-thick shells. Investigation of the heterojunction transport properties, both in dark and under illumination, and with polarization radially inward and outward, can inform the design of the polar oxide nanowire-based cells.

Terahertz spectroscopy and UV/visible transient absorption (TA) spectroscopies can be used to probe dynamics of photoexcited carriers and carrier mobility. Carrier lifetimes and mobilities are the primary determining factors in the carrier collection length, which determines the optimal thickness of the absorber coating. Temperature dependent time-resolved terahertz spectroscopy (TRTS) and TA spectroscopy is performed using an ultrafast laser system. THz time domain spectroscopy (THz-TDS) is a powerful technique to probe conductivity in conventional semiconductors, because carriers typically have scattering rates on the order of $10^{12}$-$10^{14}$ s$^{-1}$, enabling detailed modeling. TRTS probes the transient far-IR response after photoexcitation with a UV/visible/mid-IR pump pulse, with sub-picosecond time resolution. TRTS can be applied to measure the carrier dynamics in bulk ZnO as well as ZnO thin films and nanostructures. Temperature-dependent studies have been used to reveal donor densities and activation energies, and photoexcited carrier lifetimes and mobilities can be measured as a function of microstructure and morphology. The non-contact measurement of electrical properties is particularly appealing for new materials being developed here because there is no need to search for new schemes to make ohmic contacts, as would be the case with standard electrical measurements. While photon flux is much higher in these pulsed experiments than in actual solar irradiation, the measurements provide useful insight and define limiting performance in high-flux conditions.

UV/vis TA is an excellent complement to TRTS, because TA measures interband dynamics with sub-100 femtosecond resolution using a broadband UV/vis probe after photoexcitation by a tunable pump pulse.

THz spectroscopy and TA have rarely been applied to investigate complex oxides. In perovskites, terahertz spectroscopy has been used to probe low-energy excitations in charge-ordered manganites, polaronic conduction in $SrTiO_3$, and polarization dynamics in ferroelectric $BiFeO_3$. TA has been used to investigate photoinduced charge and spin dynamics as well as charge transfer for photocatalytic water splitting. However, the application of TRTS and TA to probe photoexcited carrier lifetimes, mobilities, and ultrafast interfacial charge transfer in semiconducting FE remains an unexplored and promising field.

Materials Design of New Candidate FE Absorber Semiconductors. Guided by theoretical predictions new semiconducting polar perovskites can be synthesized through the incorporation of $Ni^{2+}$ and oxygen vacancies into ferroelectric hosts. New families of bismuth-based perovskites can also be synthesized, where the substitution of $Bi^{5+}$ into a polar end-member is predicted to yield properties in the targeted range. These semiconducting ferroelectric ceramics can also be used as ceramic targets for the fabrication of new materials in thin film form using PLD.

The range of stable semiconducting polar absorbers can be expanded by exploring the incorporation of $Ba(Ni_{1/2}Nb_{1/2})O_{2.75}$ into $(Na,K)NbO_3$ solid solutions that have shown enhanced ferroelectric activity. We can also probe the effect of the redox chemistry of $Ni^{2+}$ on the FE polarization and the band gap. Thermogravimetric analyses (TGA) and measurements using XPS indicate that as-prepared samples of KBNNO contain oxygen vacancies with Ni in the 2+ state. However, after a low-temperature (≈600° C.) anneal under oxygen, weight gains observed in the TGA and associated changes in the color of the samples suggest that the redox chemistry and perhaps the band gap can be tuned through controlled oxidation of $Ni^{2+}$ to $Ni^{3+}$. The influence of this oxidation reaction can be explored on the FE properties and the photovoltaic activity.

The second focus for our materials discovery involves substitutions of $Bi^{5+}$ onto the B-site sub-lattice of FE end-members. $Bi^{5+}$-substituted systems such as $BaBiO_3$-PT and $K(Nb,Bi)O_3$ also yield semi-conducting FEs with gaps in the optical range. Davies has attempted to synthesize bulk samples of $BaBiO_3$-PT; these experiments, however, yielded two-phase mixtures of $BaBiO_3$ and PT. Apparently, the volume mismatch of the perovskite sub-cells in these two end-members (PT=63.1 Å$^3$, $BaBiO_3$=82.2 Å$^3$) is too large to permit mixing. Other examples of $Bi^{5+}$-containing systems are known in the $A^{2+}(B^{3+}_{1/2}Bi^{5+}_{1/2})O_3$ family (e.g. $A^{2+}$=Ba, Sr; $B^{3+}$=La, Nd) of mixed-metal perovskites.[3] Members of this family that can be prepared using standard ceramic methods, i.e. where $Bi^{5+}$ is stable (in air) at ≈1100° C., are restricted to examples where the $B^{3+}$ counter-ion is a large cation such as $La^{3+}$, $Nd^{3+}$ or $In^{3+}$. However, the cell volumes in those systems are still too large to permit significant mixing in ferroelectric end-members such as PT or even KNO. To facilitate mixing, it is critical to reduce the mismatch by maximizing the volume of the FE end-member, while minimizing the volume of the $Bi^{5+}$ component.

Figure 16:
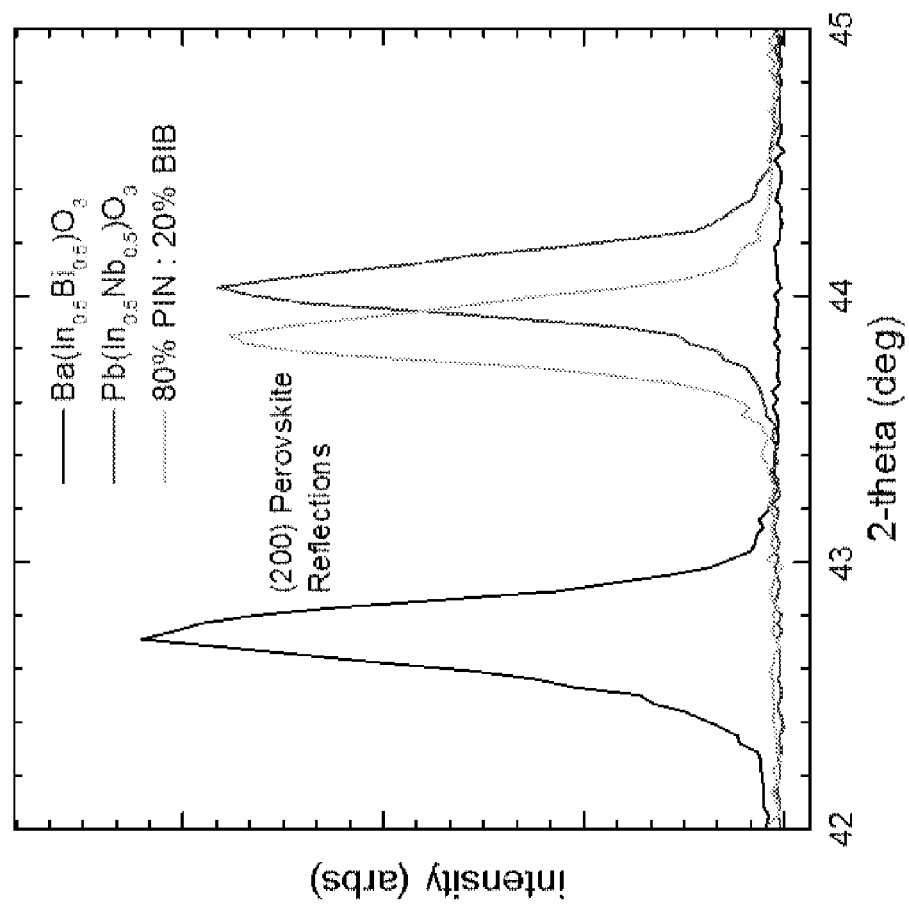
FIG. 16 depicts a section of XRD patterns from $(1-x)Pb(In_{1/2}Nb_{1/2})O_3$—$(x)Ba(In_{1/2}Bi_{1/2})O_3$ showing a shift of the (200) reflection from x=0.
Figure 17A:
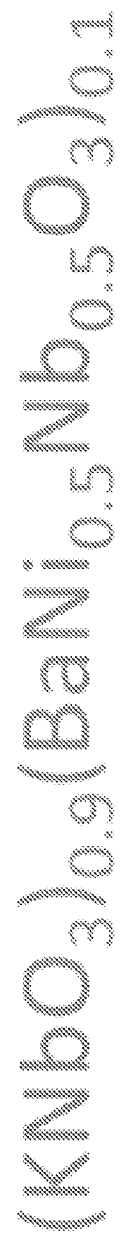
FIGS. 17 A-G depict the preparation and surface characterization of KBNNO lamellae used in the experimental results described herein.
Figure 17B:
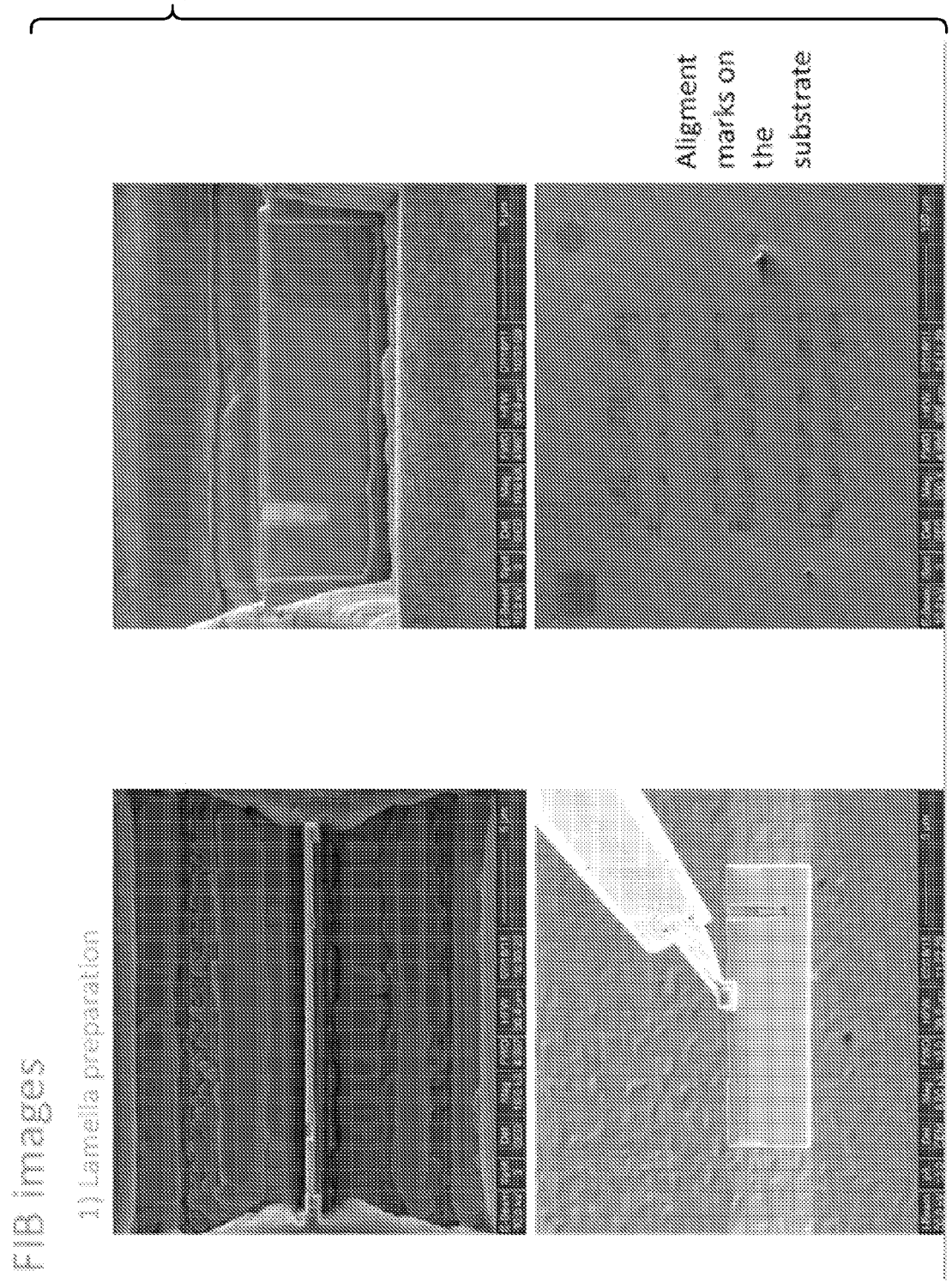
Figure 17C:
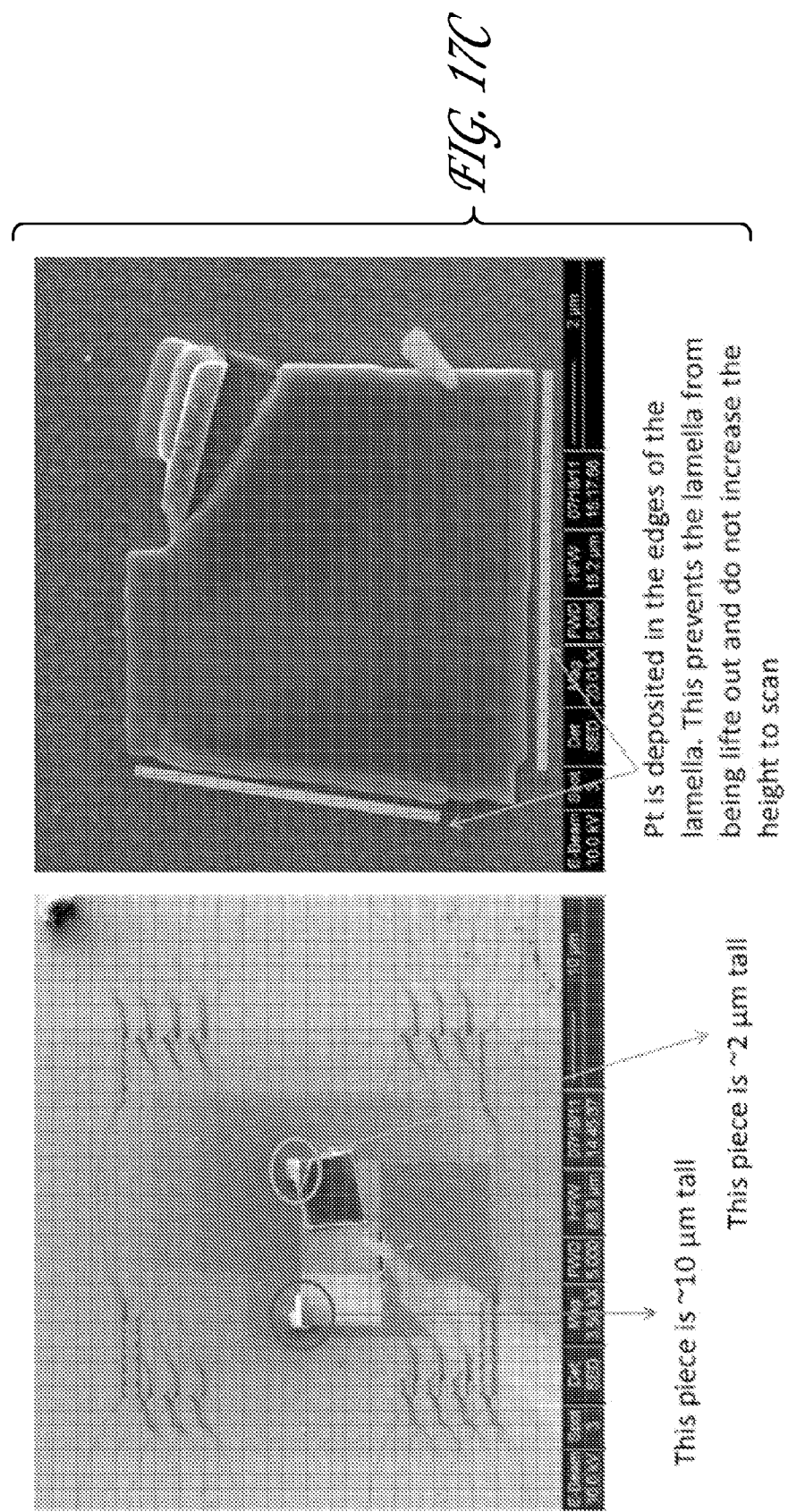
Figure 17E:
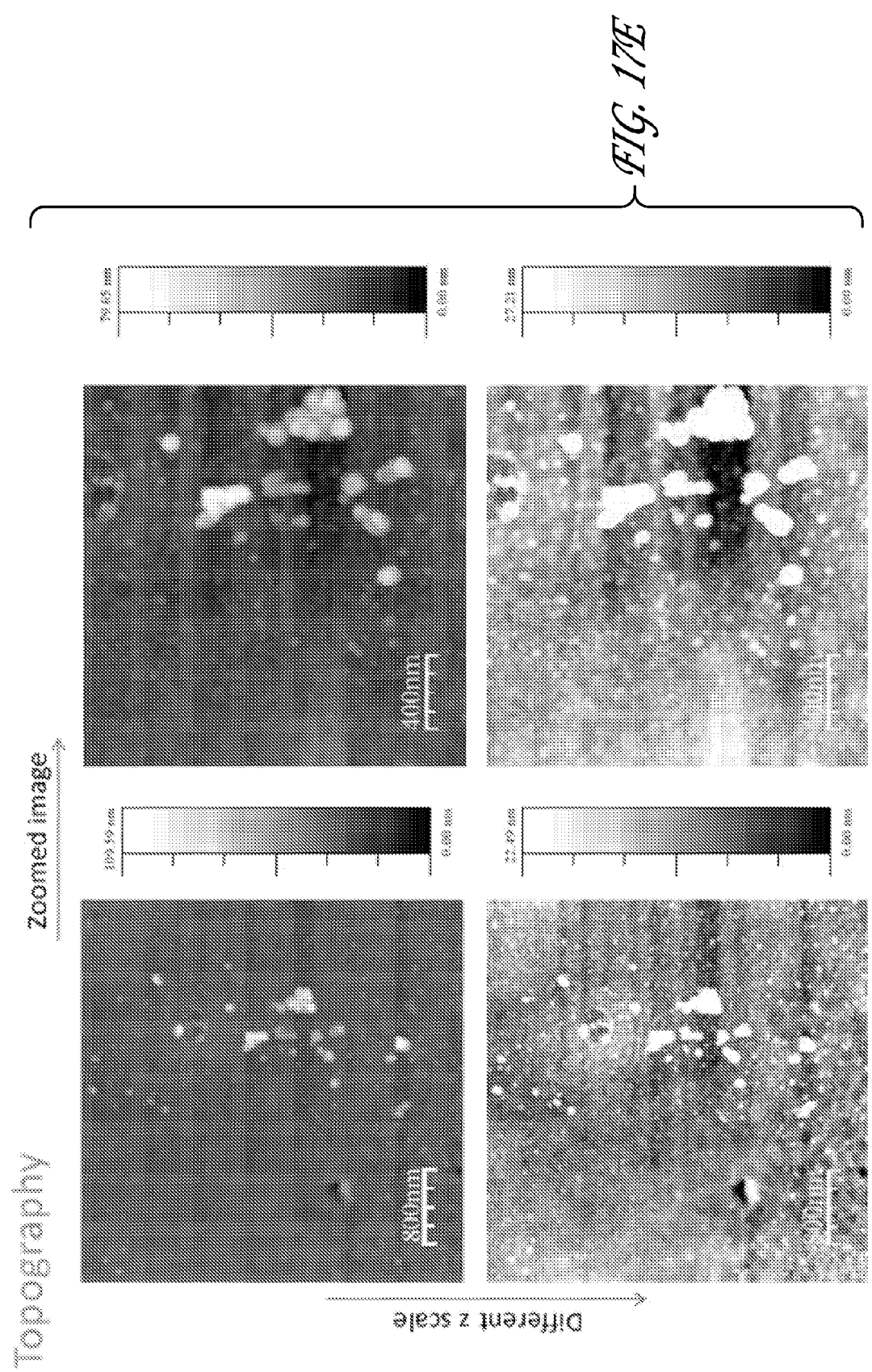
Figure 17F:
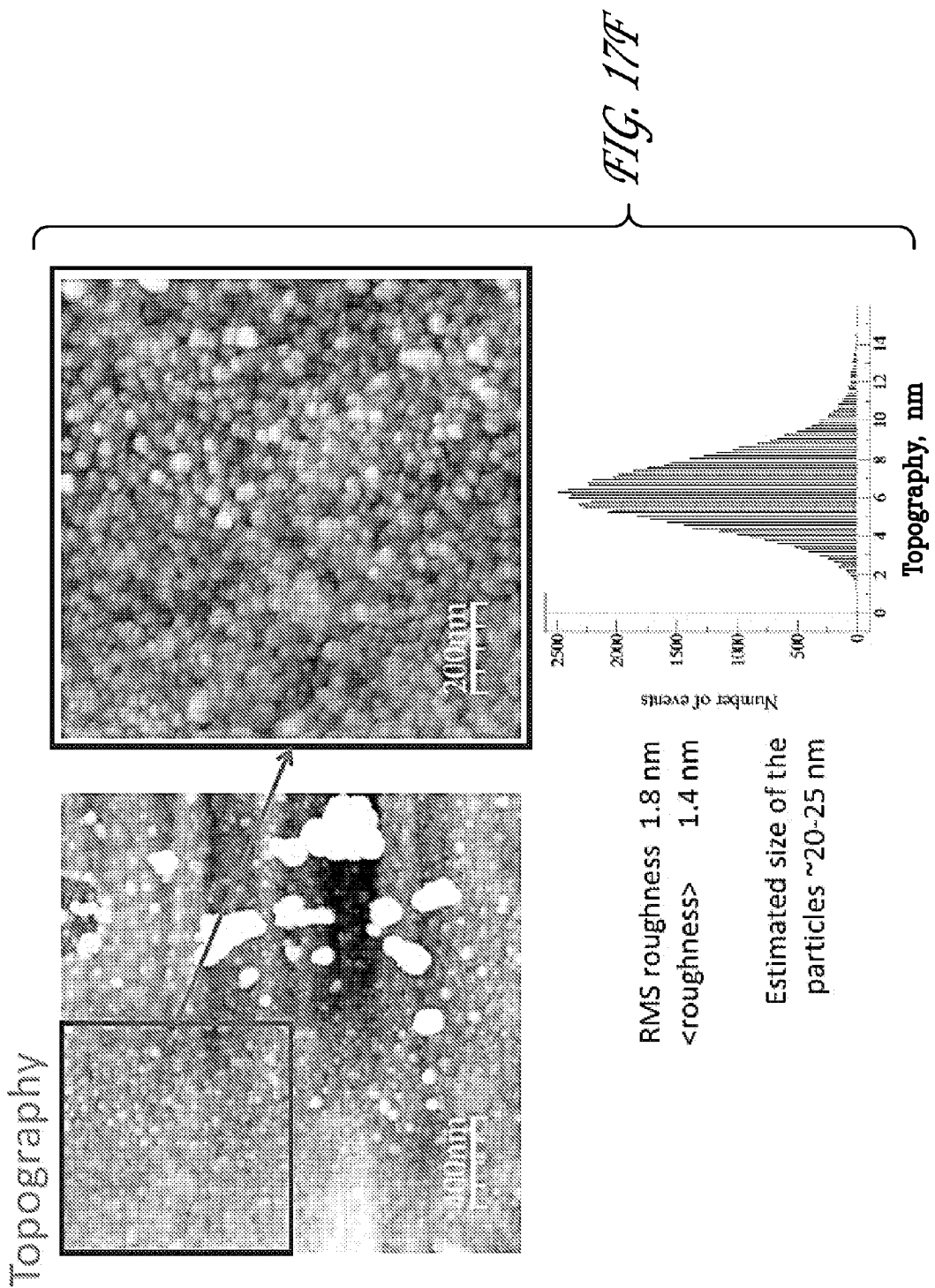
Figure 18A:
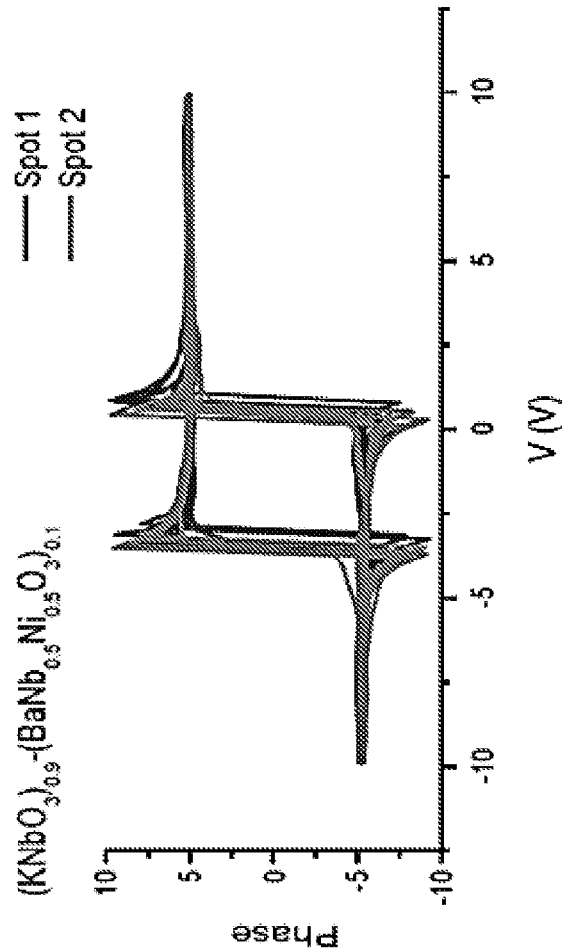
FIGS. 18A-D depict phase and amplitude of piezoelectric hysteresis loops of KBNNO lamellae used in the experimental results described herein.
Figure 18B:
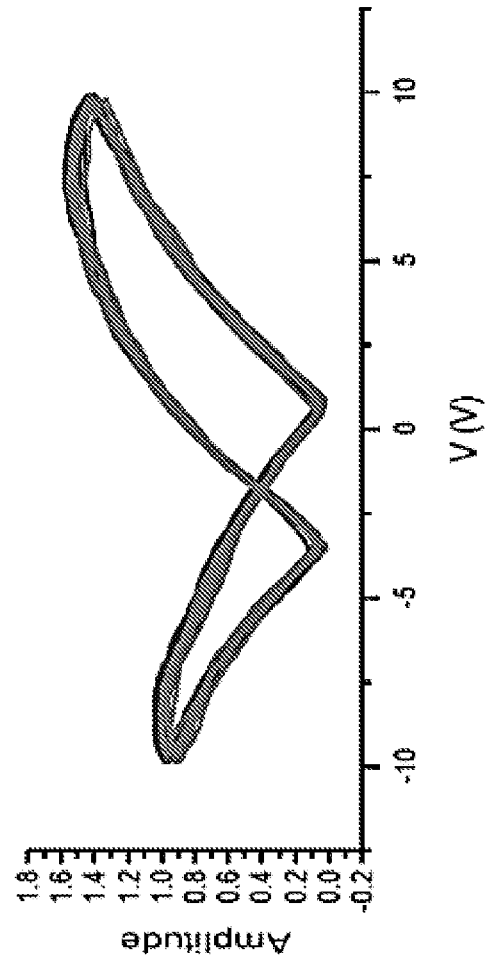
Figure 18C:
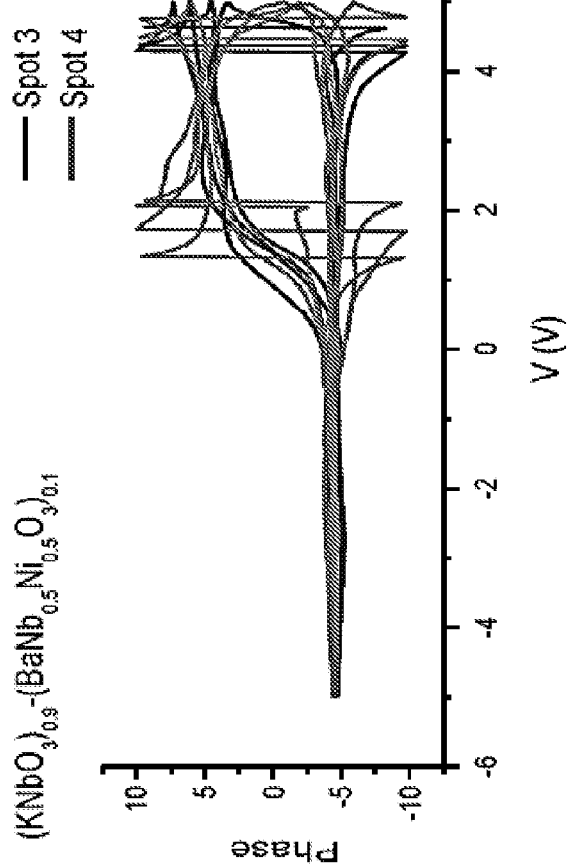
Figure 18D:
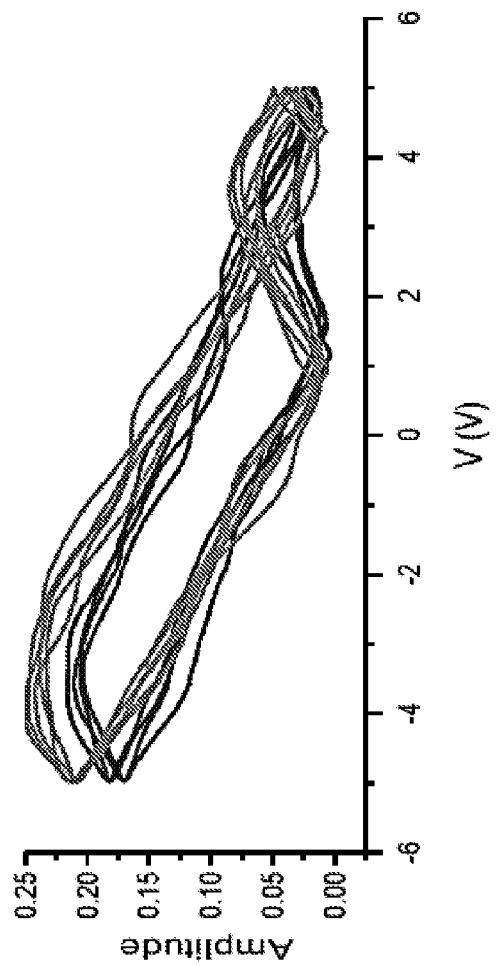

Preliminary experiments of systems where the ferroelectric component has one of the largest known volumes, $Pb(In_{1/2}Nb_{1/2})O_3$ (PIN: V=69.5 Å$^3$) is known, and the candidate $Bi^{5+}$ additive has one of the smallest possible $B^{3+}$ cations ($In^{3+}$), i.e. $Ba(In_{1/2}Bi_{1/2})O_3$ (BIB, V=76.6 Å$^3$). The positions of the peaks in the X-ray patterns of (1−x)(PIN)-x(BIB) show a clear shift relative to the two end-members (FIG. 16), indicating that the system shows extensive solubility. We can prepare a series of compositions in this system and other volume-matched $Bi^{5+}$ components such as $Ba(Sc_{1/2}Bi_{1/2})O_3$ (V=73.7 Å$^3$) and $Sr(Sc_{1/2}Bi_{1/2})O_3$ (V=68.4 Å$^3$), where extended solubility in PIN or FE $Pb(Sc_{1/2}Nb_{1/2})O_3$ (V=67.9 Å$^3$) occurs. The FE properties and band gaps of these systems, which according to our first principles calculations fall in a range suited to significant photovoltaic effect.

Modeling of Oxide Interfaces and New Oxide Semiconductor FEs. To provide guidance for the development of the new FE absorber materials and for the experimental fabrication of the interfaces, we can use first-principles DFT and thermodynamic modeling. Theoretically predicting the rich variety of reconstructions found for perovskite surfaces is possible. This theory can also show how synthesis and annealing pathways can be modified to create off-stoichiometry surfaces with a desired composition and structure. Surface composition and structure is highly sensitive to the polarization of the oxide. A first-principles methodology can be used for calculating the photocurrent generated by the bulk photovoltaic effect. Comparison of the calculated and the observed photocurrent for single crystal BaTiO3 shows that BPVE is the main mechanism for the separation of photoexcited carriers by the bulk of a single-crystal polar material.

Surfaces of the bare FE, the top and bottom conductors and the interfaces of the FE with the top and bottom conductors can be investigated with ab initio thermodynamics methods to provide guidance for the most advantageous synthesis pathway. We can first determine the thermodynamically favorable composition and structure at the interface under various synthesis conditions. Here, the redox chemistry of the Ni cation can be important, as it is possible that the interactions at the interface can change the oxidation state of Ni and the band gap. We can then calculate the short-circuit photocurrent for the resultant heterostructure using our BPVE methodology. Comparison with the results of the bulk BPVE calculation can determine the effect of the interface. To investigate the impact of the interface quality on the heterostructure properties, we can also perform calculations for structures where point defects (e.g. oxygen vacancies) are introduced into the perfect, thermodynamically favored interface structure. We can also investigate the impact of the bulk polarization direction and the structure and composition of the interfaces on the band gap, band bending and alignment, electric field distribution, and charge density, since these properties are all important for light absorption and carrier separation and mobility. A deep understanding of the relationship between external conditions, interface stoichiometry, and structure and properties can then allow us to suggest changes in the synthesis pathways to produce improved, higher-quality FE/conductor interfaces.

Nevertheless, it is possible that to enable scalable synthesis and obtain the required interface properties, modification of the FE oxide's composition or even an entirely new perovskite material may be required. In this case, we can use computational techniques to design new FE semiconductors with required interface properties as candidates for integration into the solar cell.

Low band-gap FE materials, based on $Ni^{2+}$ and $Bi^{5+}$ substitution can also be fabricated. For the $Bi^{5+}$ substitution work, we have identified several promising candidate compositions (e.g. PIN-BIB) as outlined above. For these, our main task can be to calculate electronic properties, to determine whether good FE behavior and a low band gap are in fact expected for the proposed compositions, thus narrowing down the list of possible candidate solutions. Additionally, we can examine compositional replacement of Sc ions in the B-site due to the high cost of Sc metal. Here, the most promising strategy is to use a combination of a +2 and a +4 cations with the same or larger average size as the $Sc^{3+}$ (e.g. $Mg^{2+}$ and $Zr^{4+}$, or $Cd^{2+}$ and $Zr^{4+}$, or $Mg^{2+}$ and $Tb^{4+}$).

For all compositions studied, we can use DFT to calculate the formation energy, the polarization magnitude and the band structure. Photovoltaic response to electric fields (shift current tensor) can be calculated using the BPVE methodology. Due to the known inaccuracy of the LDA method for band gaps, we can use the LDA+U approach and perhaps a hybrid functional calculation (e.g. using the PBE0 functional) to improve the accuracy of the band gap prediction. For selected structures, we can use the GW method, since it is the most accurate for band gaps but the most computationally-expensive.

Fabrication of model solar cells incorporating semiconducting FE. Solar cells can be fabricated to incorporate semiconducting FEs as the absorber and charge separation material. Simplified versions of the solar cell are first tested to select materials and interfaces. For example, planar cells based on epitaxial FE films are tested to measure light absorption and charge collection for the case of ideal, defect-free interfaces. Conflicting constraints requiring thicker films for light harvesting and thinner films for charge collection can likely dictate the use of nanostructured ETA architectures to achieve high efficiency.

The solar cells may also, but not necessarily, include p- and n-type contacts. In a conventional solar cell, the p-n junction creates the electric field to separate electrons and holes. However, poled FE have a permanent polarization that can drive electrons and holes to opposite contacts (via the BPVE) without the need for the built-in field of a p-n junction. Photovoltaics based on FE $BiFeO_3$ with symmetric metal contacts have been demonstrated. One metal and one transparent conducting oxide contact may provide a good quality device. Finding ohmic contacts to KBNNO with appropriate work functions and high quality interfaces can be a key challenge to such a design. While the p- and n-type layers may not be strictly necessary for charge separation, they could add significant versatility and flexibility to the design. For example, thin films of p- and n-type layers could serve as buffers between the FE and the conductive contacts to reduce the number of constraints on any single material or interface.

One embodiment of a FE ETA cell can use all perovskite materials for exceptional interfacial fidelity, with highly conductive n- and p-type materials and a FE absorber. The nanowire array can be either n-type or p-type, depending on synthesis capabilities, with the pore-filling material taking on the opposite function. FE processing temperatures can be too high for typical transparent conducting oxide films such as ITO, so two options can be considered. Transparent conductive perovskites such as $Nb:SrTiO_3$ can be used in a superstrate configuration, or metal-coated glass or metal foils with perovskite film buffer layer can be used in the substrate configuration with ITO or AZO deposited after FE processing is completed. A suitable architecture can be provided using n- or p-type nanowires, lattice-match materials, and by the band positions and work functions of available materials. The band diagram can take on a staircase-like structure with type II band offsets, to facilitate interfacial charge transfer in the desired direction while blocking the opposite charge from moving in that direction.

ZnO nanowire arrays can initially be used as the n-type material. These can be used for ETA cells with chalcogenide absorbers and also for DSSCs. However, the ZnO/absorber interface is likely to be highly defective. We can consider ALD of a very thin (~1-3 nm) buffer layer to passivate defects while allowing tunneling of carriers. Similar strategies have been successful in DSSCs. Suitable buffer layers may include $Al_2O_3$ or $TiO_2$. The effect of non-epitaxial interfaces on the FE character of the thin absorber compared to an epitaxial perovskite interface using both solar cell and ex situ materials characterization is investigated. Liquid electrolytes can be used as the hole conductor in the early investigative stages, to facilitate good contacts with a tunable redox potential, although stability of the FE in electrolyte can have to be monitored. Solid state p-type materials are selected that have appropriate band offsets to accept holes from the absorber while blocking electrons.

Using the materials described herein, optimal absorber thickness is determined via charge separation and bulk recombination. The charge collection length of the FE absorber, with and without polarization, is determined using a combination of planar solar cells of varying thickness and ex situ materials measurements. If the collection length is much smaller than the optical absorption depth, then nanostructured ETA configurations can be required to improve light harvesting. The thickness of the FE coating on the nanostructured electrode can be as large as possible to minimize interfacial area while still enabling efficient charge separation. Based on the optimal thickness, the nanowire length, diameter, and pitch can be designed to provide the interfacial area necessary to harvest nearly all visible light, as well as appropriate pathways for electron and hole collection.

Simulation tools such as "Analysis of Microelectronic and Photonic Structures" (AMPS) can be used to help guide materials selection and device design. AMPS requires data such as absorption spectra and density of states of each layer as input, and it then calculates the expected band structure, electric field distribution, and photovoltaic response by solving Poisson's equation and the continuity equations. While AMPS can provide some guidance, it is limited to 1D and does not explicitly account for the BPVE of our FE absorbers. Therefore, modifications to AMPS or homegrown code can also be used.

Working solar cells are tested using I-V characterization and wavelength-dependent light harvesting and quantum efficiency measurements, as well as intensity-modulated photocurrent and photovoltage spectroscopy, impedance spectroscopy, and current and voltage decay measurements. These techniques can be used to determine limitations in power conversion efficiencies and to investigate fundamental aspects of charge transport and recombination in DSSCs, organic solar cells, and chalcogenide-based ETA cells. The combination of solar cell studies with characterization of nanowires and thin films of functional oxide-based structures can provide valuable feedback for materials selection, processing, and architecture design and can enable optimization of a robust lab-scale solar cell.

Measuring IQE of ETA cells with different nanowire lengths but the same absorber properties can allow us to confirm whether it is interfacial recombination during charge transport or bulk recombination during charge separation that limits overall efficiency. IQE that is independent of nanowire length indicates a charge separation-limited regime, while IQE that decreases with increasing nanowire length indicates transport-limited. Light harvesting efficiency (LHE) measurements can indicate whether the absorber volume is large enough to harvest all incident light. If absorbance is low, absorber thickness should be increased if IQE is transport-limited but nanowire surface area should be increased if IQE is charge separation-limited. Surface area can be increased by increasing either the length or the number density of the nanowires. Increasing number density would be desirable if the cross-sectional areas of individual nanowires and pore-filling materials are large enough to support the necessary current density without resistive losses. The size necessary to be "large enough" depends on the conductivity of the two materials. Measuring material properties and using them in some simple modeling can provide significant insight into design of optimal architectures.

The oxide-based solar cells described herein have the potential to be cheaper than crystalline silicon solar cells and much more robust than DSSC or organic solar cells. The new thin film solar cells can therefore offer the prospect of competing with conventional non-renewable electricity production from coal or oil. Market volumes for thin film solar cells are already in the multibillion dollar range and are expected to grow strongly in the future. A more widespread use of solar energy can also reduce $CO_2$ emissions. Availability of efficient, low-cost, clean, and sustainable solar cells made from earth-abundant, non-toxic materials would transform the US and global energy portfolio.

Fundamentally, the work carried out according to this specification can be used to develop novel polar semiconductor oxide compositions, new thin film and nanoheterostructure fabrication methods, and can enrich the understanding of how the epitaxial interfaces affect carrier transport from the absorber to the electrode. Design, synthesis, and characterization of new FE oxides with band gaps in the range of 1-2 eV can enable many new applications in optoelectronics as well as photovoltaics. New mechanisms of charge separation elicited by the poled FE absorber without the need for a p-n junction could lead to a new paradigm in solar cell design.

EXAMPLES

To design FE perovskites with low band gaps, we pursue the strategy of using two different transition metal cations on the perovskite B-site, with one cation driving ferroelectricity and the other giving an $E_{gap}$ in the visual range. Without being limited by any theory of operation, it is believed that substitution of a Ni, Pd, Pt d10 cations in the +2 oxidation state combined with a vacancy into the perovskite lattice leads to a decrease in the band gap as the substituent d states are placed in the gap. Thus for Ni-doped $PbTiO_3$, the Ti on the B-site provides the off-center distortion and polarization while Ni d states in the $PbTiO_3$ gap gives rise to a low $E_{gap}$. While low-band gap FE semiconductors can be achieved, for practical devices, the semiconductor ferroelectric is desirably thermodynamically stable and able to be fabricated by an inexpensive, scalable route. In a specific embodiment disclosed herein, we report that solid solutions of $KNbO_3$ (KNO) and $BaNi_{1/2}Nb_{1/2}O_{3-\delta}$ can be synthesized using solid state conventional methods, are polar at room temperature and exhibit direct band gaps in the 1.1-1.6 eV range. Accordingly, these materials are suitable for utilizing the visual part of the solar spectrum and can be used in thin film photovoltaic devices.

Sample Preparation and Characterization

Solid Solution: $KNbO_3$—$BaNi_{0.5}Nb_{0.5}O_{3-\delta}$

A solid solution of $KNbO_3$, a well-known ferroelectric material, and $BaNi_{0.5}Nb_{0.5}O_{3-\delta}$, which is not a stable phase on its own was synthesized. The solution formula may be written as $(K_{1-x}Ba_x)(Nb_{1-x/2}Ni_{x/2})O_{3-\delta}$, where we have made materials between $0 \le x \le 0.5$ in increments of 0.1.

Synthesis:

All samples were made by weighing out stoichiometric quantities of $K_2CO_3$, $BaCO_3$, NiO (green) and $Nb_2O_5$ and mixing them by grinding in a mortar and pestle. The powders were then ball-milled using yttria-stabilized zirconia planetary milling media in ethanol for 2 hours. The dried powders were then calcined on Pt foil in an alumina crucible at 900° C. for 12 hours. ~300 mg aliquots were pressed into 0.25" pellets in a uniaxial press. The pellets were then isostatically pressed in an oil medium at 80,000 psi. The pellets were then placed on Pt foil in a covered alumina crucible, surrounded by sacrificial powder of the same composition, and sintered at temperatures between 1050-1250° C., depending on the composition. $KNbO_3$ melts at ~1050° C. and is sintered at a lower temperature, whereas $K_{0.5}Ba_{0.5}Ni_{0.25}Nb_{0.75}O_{3-\delta}$ is sintered above 1200° C. to achieve >90% theoretical density. Water absorption is known to be a problem with $KNbO_3$. As such, at all stages of synthesis samples are either kept at elevated temperature (at least 200° C.) or in a dessicator, and exposure to moisture is kept to a minimum.

Figure 8:
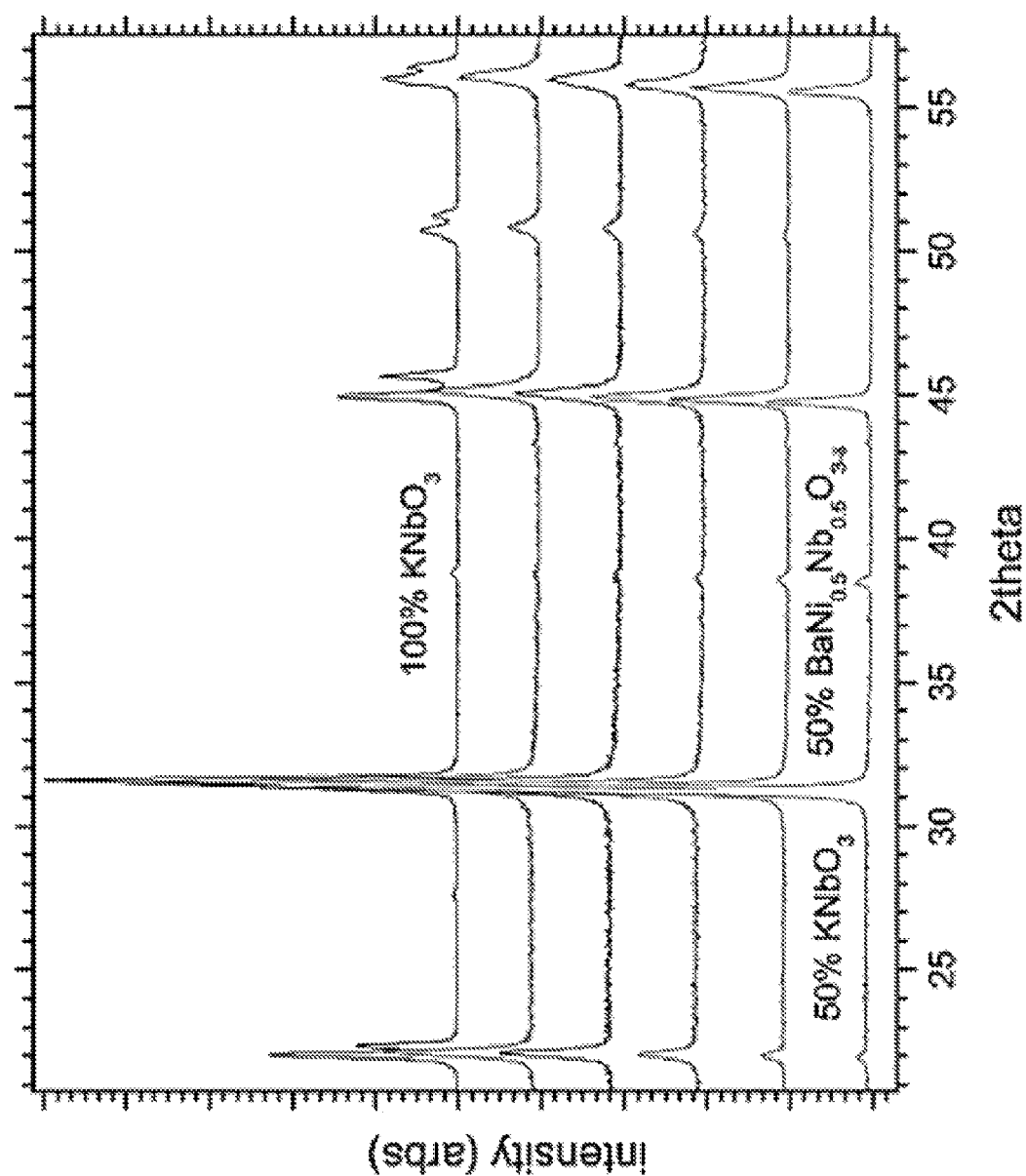
FIG. 8 depicts X-ray diffraction patterns of embodiments of various compounds of the present invention.

Powder Diffraction and Structural Distortion:

$KNbO_3$ has an orthorhombic distortion from cubic symmetry at room temperature that can be clearly seen in the peak splittings of a powder X-ray diffraction (PXRD) pattern. 10% doping of $BaNi_{0.5}Nb_{0.5}O_{3-\delta}$ results in a pattern that appears cubic to the resolution of our laboratory X-ray diffractometer (XRD). However, with increased doping, the peaks in the pattern gradually sharpen, indicating that the degree and temperature of the structural transition are both being depressed by the doping. It is possible that in the lower levels of doping, there is a small distortion that is not resolvable by our instrument. The unit cell parameters increase with increased levels of doping. (FIG. 8)

Figure 9A:
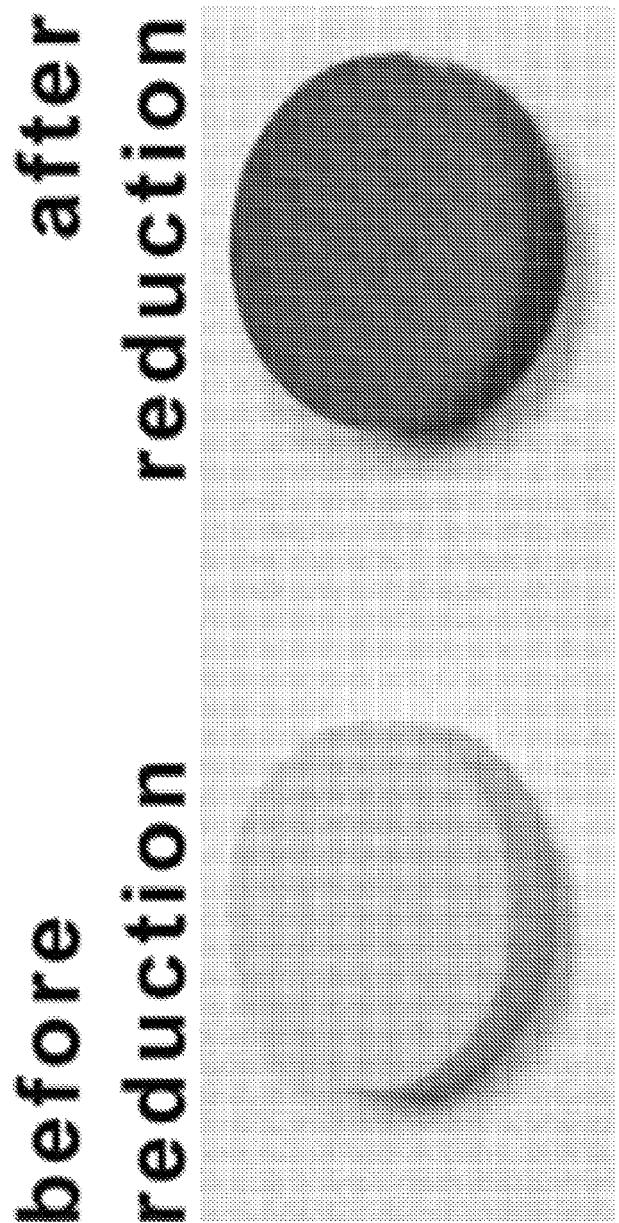
FIGS. 9A and 9B depict sample preparation, before reduction (light color) and after reduction (dark color).
Figure 9B:
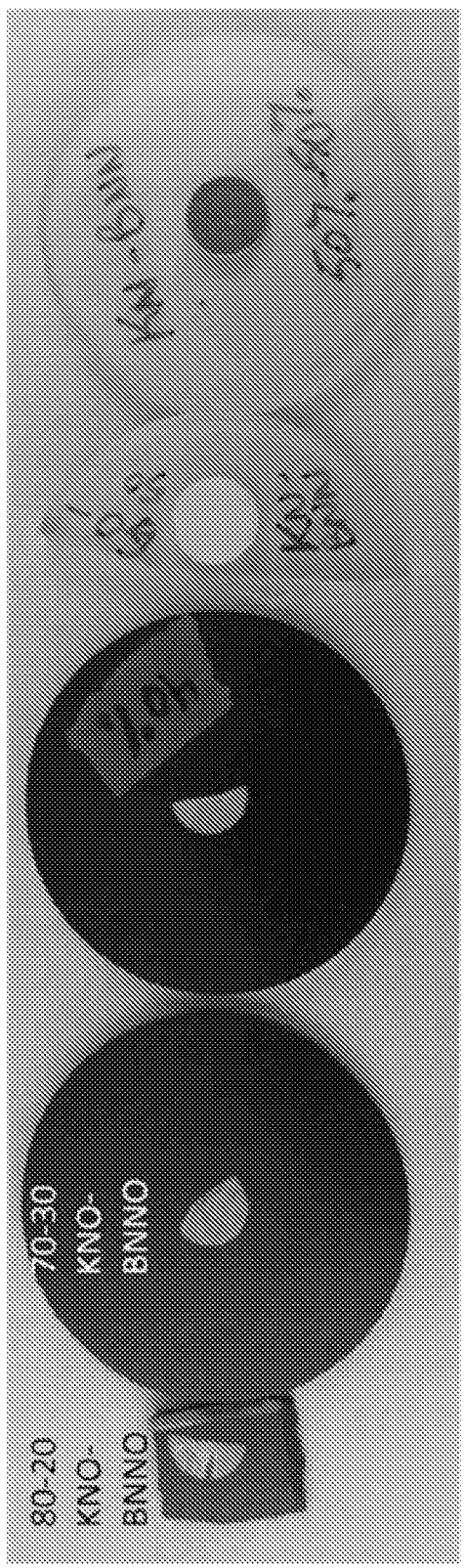
Figure 11:
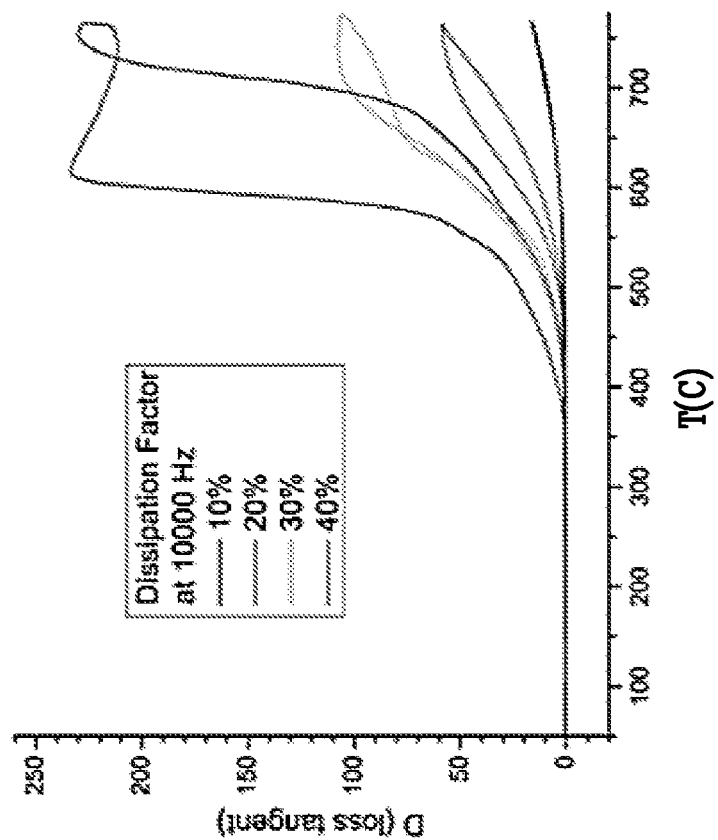
FIG. 11 depicts loss tangent versus temperature at different frequencies for various compounds of the present invention.
Figure 10:
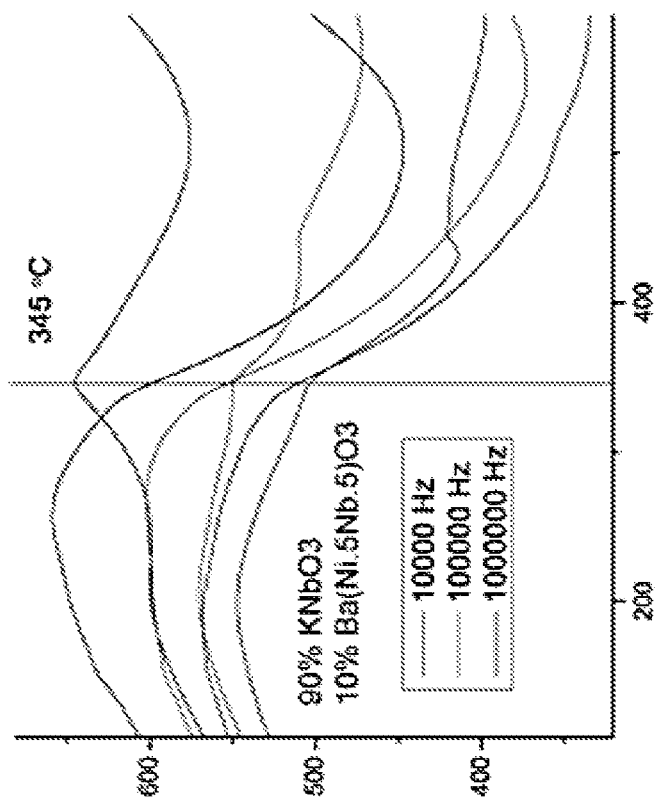
FIG. 10 depicts dielectric constant versus temperature at different frequencies for various compounds of the present invention.

Ni Oxidation State and Oxygen Stoichiometry:

Because Ni can easily exist in either the 2+ or 3+ state, the oxygen content in the solid solution of this perovskite (Nominal formula $ABO_3$) can vary from between 3 if all the Nickel is 3+, down to 3−(x/4), if all the Nickel is 2+. When made in air, un-sintered pellets appear yellow in color. When treated with 5% $H_2$/95% Ar at 900° C. for 8 hours, the pellets turn to a blackish gray, indicating some level of reduction and accompanying oxygen loss. (FIGS. 9A and 9B) Quantification of this oxygen loss should be possible by thermogravimetric analysis (TGA) and should give an idea of the oxidation state of the Nickel. The XRD patterns of these reduced samples show a slightly increased background, but also show the same single phase pattern with a nearly identical lattice parameter. Further annealing in an oxygen atmosphere can result in a re-oxidation of the material.

Dielectric Measurements:

Frequency dependent dielectric constant measurements have been performed on the 10, 20, 30 and 40% doped samples. Pure $KNbO_3$ shows a series of anomalies in its dielectric constant v. Temperature curves which correspond to the 3 structural transitions at −10, 225 and 435° C. In the 10% doped material, an anomaly is visible at 345° C., which may indicate a tetragonal to cubic structural transition, and may correspond to the 435° C. transition in pure $KNbO_3$. No anomaly is visible above room temperature in materials with doping levels greater than 10%. The materials become more lossy with increased doping of conductive Ni cations.

Characterization and analysis of the optical properties were carried out using variable angle spectroscopic ellipsometry (SE), and proximal probing (local ferroelectric piezoelectric switching and piezoresponse force microscopy) of the as-prepared pellet samples and of Ga+ milled lamella cross-section specimens extracted from the pellet using a focused ion beam (FIB) tool.

Spectroscopic Ellipsometry Measurement

Variable-angle SE analysis was performed (247 nm λ<1 μm) using a model M2000 (J. A. Woollam), using Glan-Taylor polarizers, a rotating compensator, and deuterium and quartz tungsten halogen lamps. Ellipsometric parameters ψ and Δ, defined via $$\tan\psi \exp(i\Delta) = \frac{Rs}{Rp}$$

are extracted from direct measurements of $R_p$ and $R_s$, the reflection coefficients for light polarization parallel (p), and perpendicular (s) to the plane of incidence. The wavelength-dependent complex index of refraction is obtained for each sample by assuming a model of a semi-infinite half space of the material surrounded by vacuum, and assuming an optically isotropic medium ($\epsilon_{11}=\epsilon_{22}=\epsilon_{33}$ and $\epsilon_{12}=\epsilon_{13}$, with $\epsilon_{ij}=ji$, with i, j=1, 2, 3. The real and imaginary components of the complex dielectric function (or optical index of refraction) are calculated via Maxwell's equations.

Figure 2A:
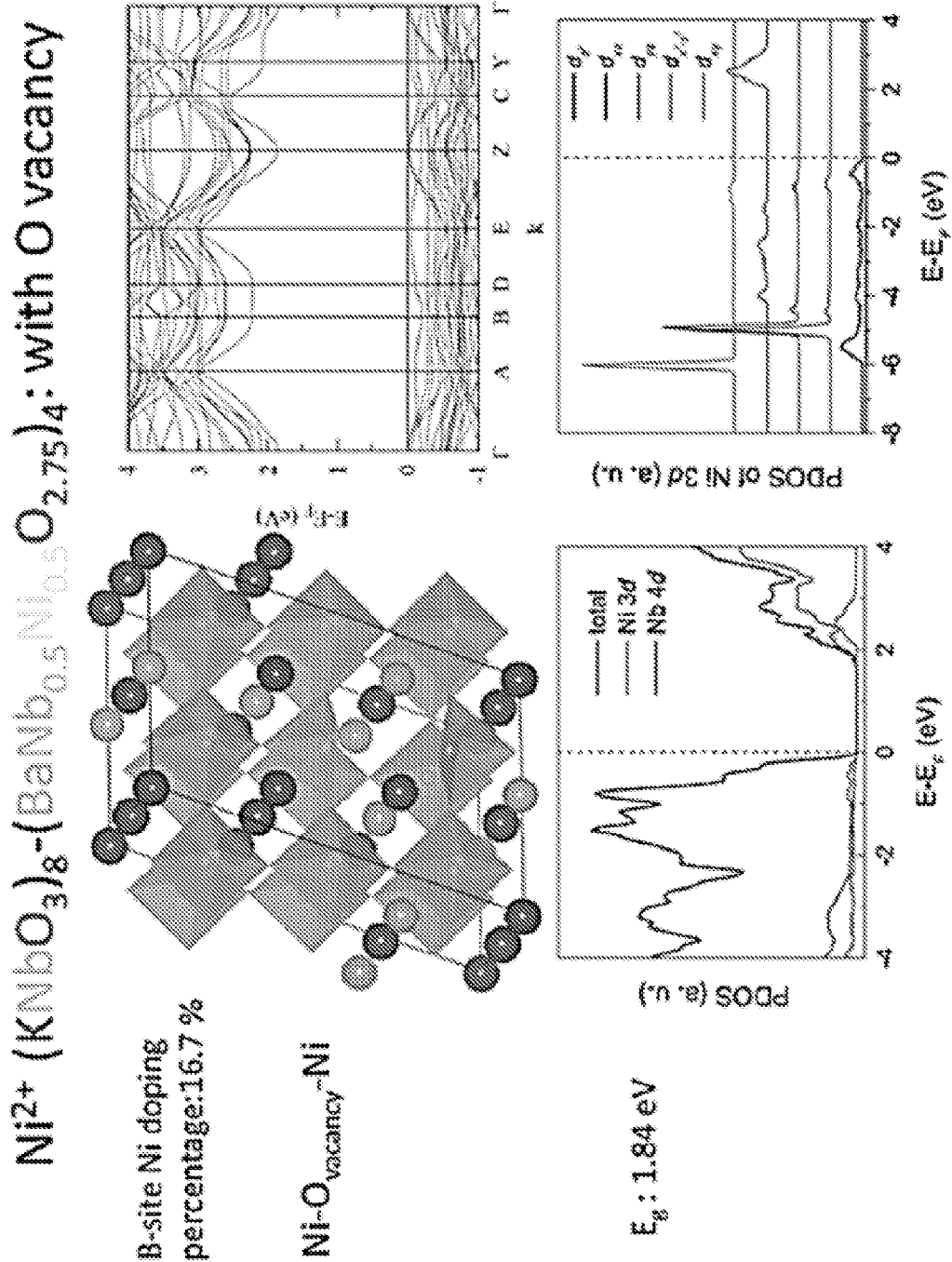
FIG. 2A depicts computational results and illustration of one embodiment of the present invention.
Figure 2B:
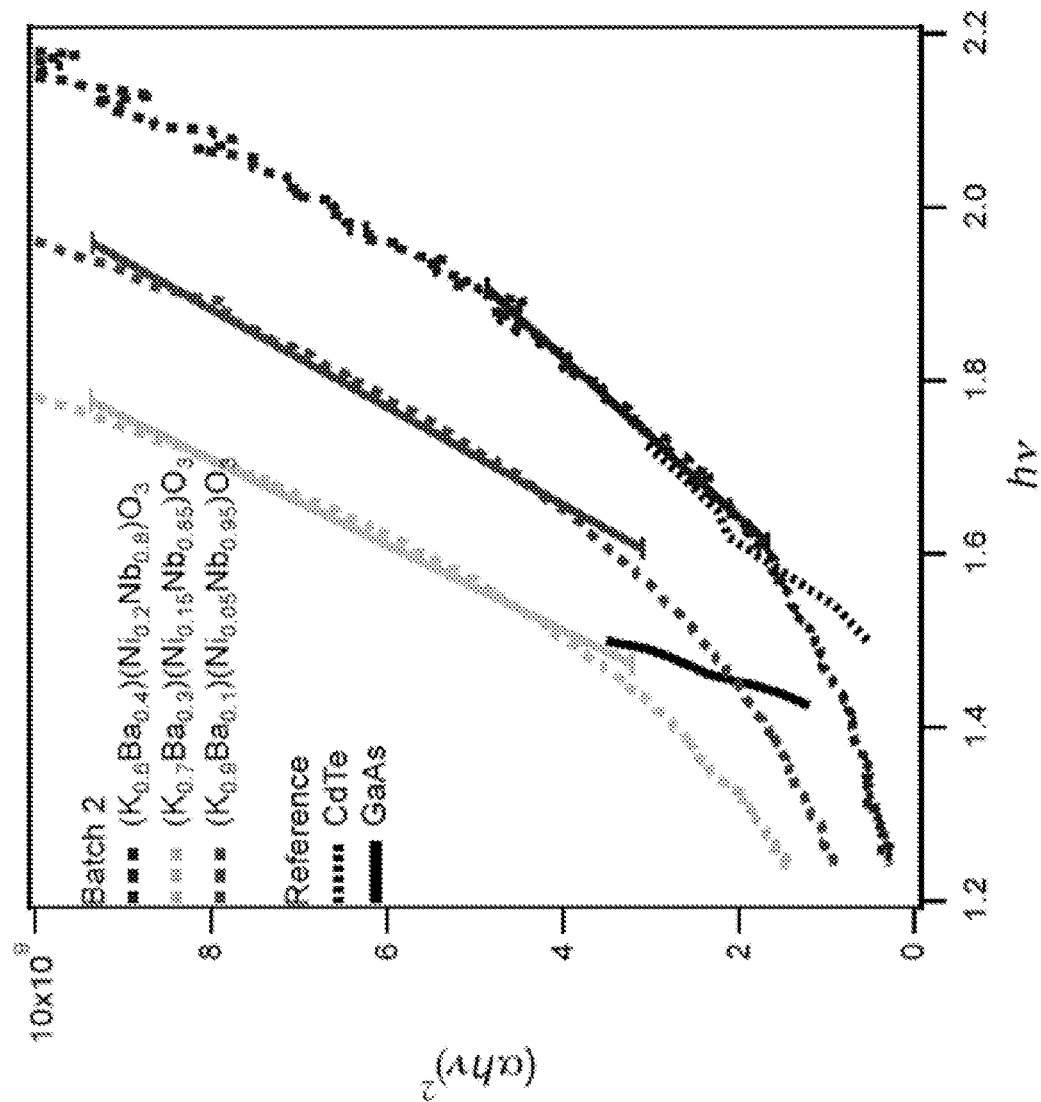
FIG. 2B depicts a plot of measured $(\alpha E)^2$ $h\omega$ for doped $KNbO_3$ pellets, and for GaAs and CdTe (as used herein, $h\omega$ means h times Greek nu or h-bar times Greek omega).

The direct and indirect optical band gaps can be estimated by extrapolating the straight line portions of the $(\alpha E)^2$ vs. hw and $\alpha^{1/2}$ vs. hw, respectively, where hw is the incident photon energy in units of eV and α is the absorption coefficient (expressed in units of $cm^{-1}$.) that can be calculated as $$\alpha = \frac{4\pi k}{\lambda}$$

with k the extinction coefficient. Shown in FIG. 2B is a plot of $(\alpha E)^2$ hw for doped $KNbO_3$ pellets, and for GaAs and CdTe.

This estimated value of the direct gap for the $KNbO_3$ sample is smaller than those reported elsewhere, but within error. Significantly, the extrapolated fitting for the doped $KNbO_3$ samples, specifically those with doping (Ba content) from 0.1-0.4 obtained from SE yields estimated direct band gaps that are much smaller than that for the undoped $KNbO_3$, with values ranging from ~1.3-1.4 eV. These samples were measured as formed, i.e. they have not been reduced (i.e. not been exposed to owing $H_2$). The calculated values for each sample are summarized in the following Table I.

TABLE I

Variation of direct gap with composition.

| Composition | Direct $E_{gap}$ (eV) |
|---|---|
| $KNbO_3$ | 3.06 ± 0.60 |
| $(K_{0.7}Ba_{0.1})(Ni_{0.05}, Nb_{0.95})O_3$ | 1.43 ± 0.06 |
| $(K_{0.7}Ba_{0.3})(Ni_{0.15}, Nb_{0.85})O_3$ | 1.32 ± 0.07 |
| $(K_{0.6}Ba_{0.4})(Ni_{0.2}, Nb_{0.8})O_3$ | 1.41 ± ?.?? |
| $(K_{0.5}Ba_{0.5})(Ni_{0.25}, Nb_{0.75})O_3$ | 2.53 |
| $(K_{0.5}Ba_{0.5})(Ni_{0.25}, Nb_{0.75})O_{3-x}$ | 2.49 |

Note:
the $2^{nd}$ row composition in Table I has a typo and should be $(K_{0.9} Ba_{0.1})$ as the K + Ba amounts should add up to 1. Note also that any of these may be oxygen deficient. All should be considered as potentially $O_{3-\delta}$.

Experimental Results

The $(1-x)KNbO_{3-x}BaNi_{1/2}Nb_{1/2}O_{3-\delta}$ (KBNNO) system was chosen to optimize the stability of $Ni^{+2}$-oxygen vacancy combination while preserving polarization. Potassium niobate has a high transition temperature (705 K) and polarization (0.6 $C/m^2$ at 0 K), driven by the off-center distortion of Nb ions. Nb ions are often found in five-fold coordination environment in oxides, and Nb-containing ferroelectric perovskites tolerate a high concentration of vacancies. Accordingly, without being limited to any theory of operation, Nb-containing ferroelectric perovskites are believed to be able to accommodate the $Ni^{+2}$-oxygen vacancy combination. Ba was chosen as the A-site substitutent as it has the same ionic size as K, promoting solubility. The large size of the K and Ba cations can also favor vacancy formation, as $Ni^{3+}$ is too small and is stable in a perovskites with $La^{3+}$ on the A-site, whereas $Ni^{2+}$ is stable in ferroelectric ("FE") $ABO_3$ such as $PbNi_{1/3}Nb_{2/3}O_3$.

The compositions at x=0.1-0.5 were synthesized by a standard solid-state synthesis methods. X-ray diffraction (XRD) results (FIG. 2A) show that the structure is perovskite for all solutions with no impurity peaks. The increase in lattice parameters with BNN substitution (Table I) is consistent with the presence of the $Ni^{2+}$ cation with large ionic size (0.68 Å) than for $Nb^{5+}$ (0.64 Å) or $Ni^{3+}$ (0.60 Å).

To examine the microscopic structure and properties of KBNN, we performed ab intitio calculations for the x=0.33 composition using a 60-atom supercell. (FIG. 3) We find that at the synthesis conditions oxygen vacancies are thermodynamically favored, indicating that the material is in the KBNN-delta state. Comparison of lattice parameters for fully oxidized compositions (KBNNOox) and KBNNO with oxygen vacancies showed that KBNNO has lattice parameters in agreement with experimental data in Table 2, unlike the case of the KBNNOox.

TABLE 2

| Composition | Lattice Parameters | Sample Density | $E_{gap}$ | $T_c$ | P | Current | Voltage |
|---|---|---|---|---|---|---|---|
| KBNNO5 | | | | | | | |
| KBNNO10 | | | | | | | |
| KBNNO20 | | 95 | 1.18 | | | $10^{-8}$ | |
| KBNNO30 | | 95 | 1.32 | | | $10^{-8}$ | |
| KBNNO40 | | 95 | 1.46 | | | | |
| KBNNO50 | | 80 | 1.97 | | | | |

Berry phase calculations found $P=0.2$ $C/m^2$, due to off-center distortions by the Nb-cations. The polarization is smaller than that of the parent $KNbO_3$ material ($P=0.6$ $C/m^2$ in LDA) but still substantial enough for room temperature stable ferroelectricity. Examination of the electronic structure of KBNNO found a direct band gap of 1.8 eV, much smaller than the 3.2 eV band gap of KNO. The VBM consists of Ni d states, while the CBM is due to the Nb d-states.

Figure 3:
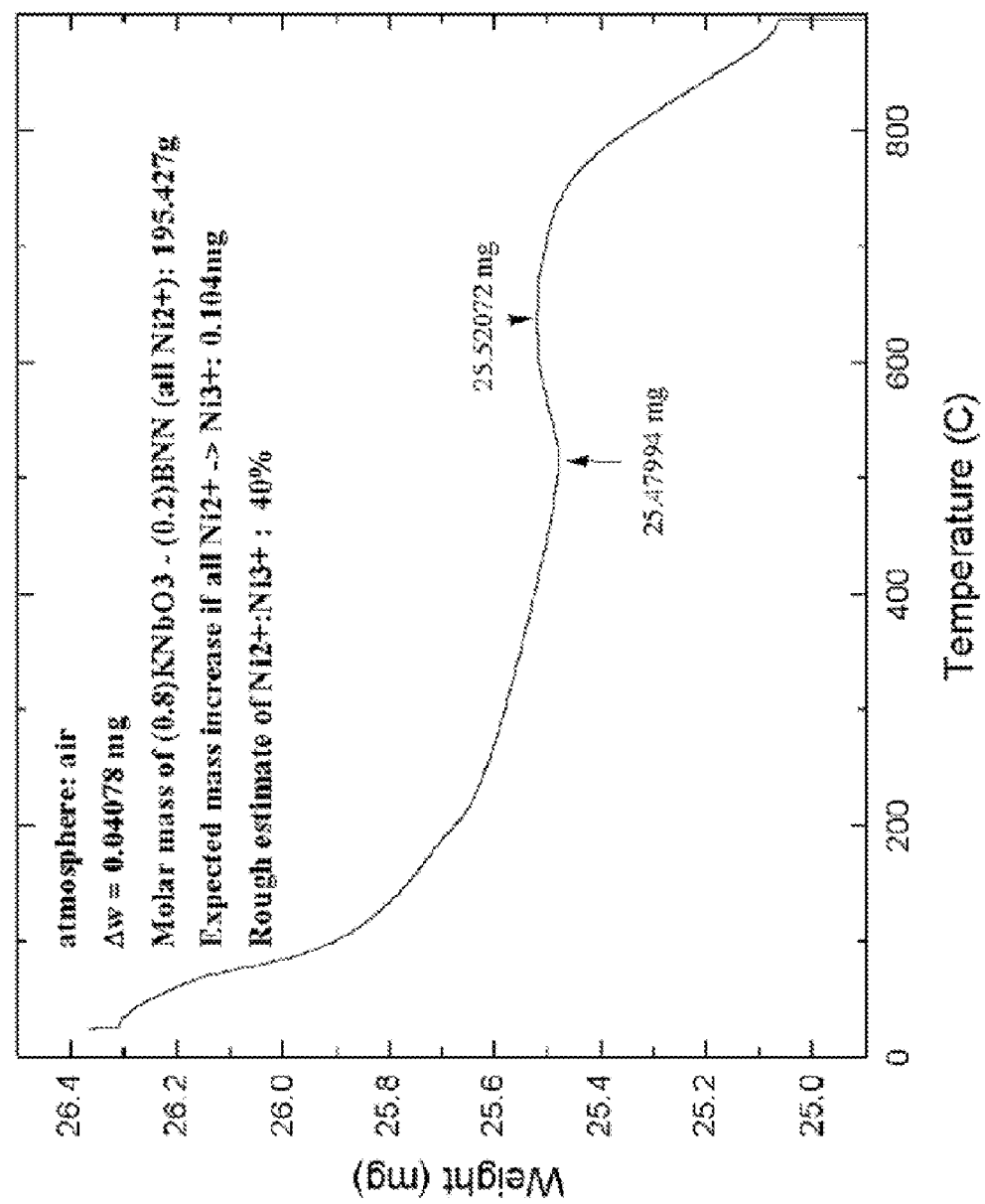
FIG. 3 depicts TGA measurements of several embodiments of compounds of the present invention.

To confirm that the Ni is in the +2 oxidation state stabilized by the vacancy we performed thermogravimetric analysis (TGA) measurements (FIG. 3). These showed that oxidizing the sample under high O pressure conditions leads to the weight gain equal to number of Ni atoms multiplied by the atomic weight of oxygen, consistent with the conversion of $Ni^{2+}$ of the original sample to $Ni^{3+}$ under oxidizing conditions. Similarly, X-ray diffraction ("XRD") of the oxidized samples shows a decrease in the lattice parameter, consistent with the smaller size of the $Ni^{3+}$ ion versus $Ni^{2+}$ ion. Finally, the sample is not conductive, in contrast to the KBNNOox, for which our ab initio LDA+U finds a metallic state. We therefore conclude that the synthesized material is indeed KBNNO-delta.

Figure 4E:
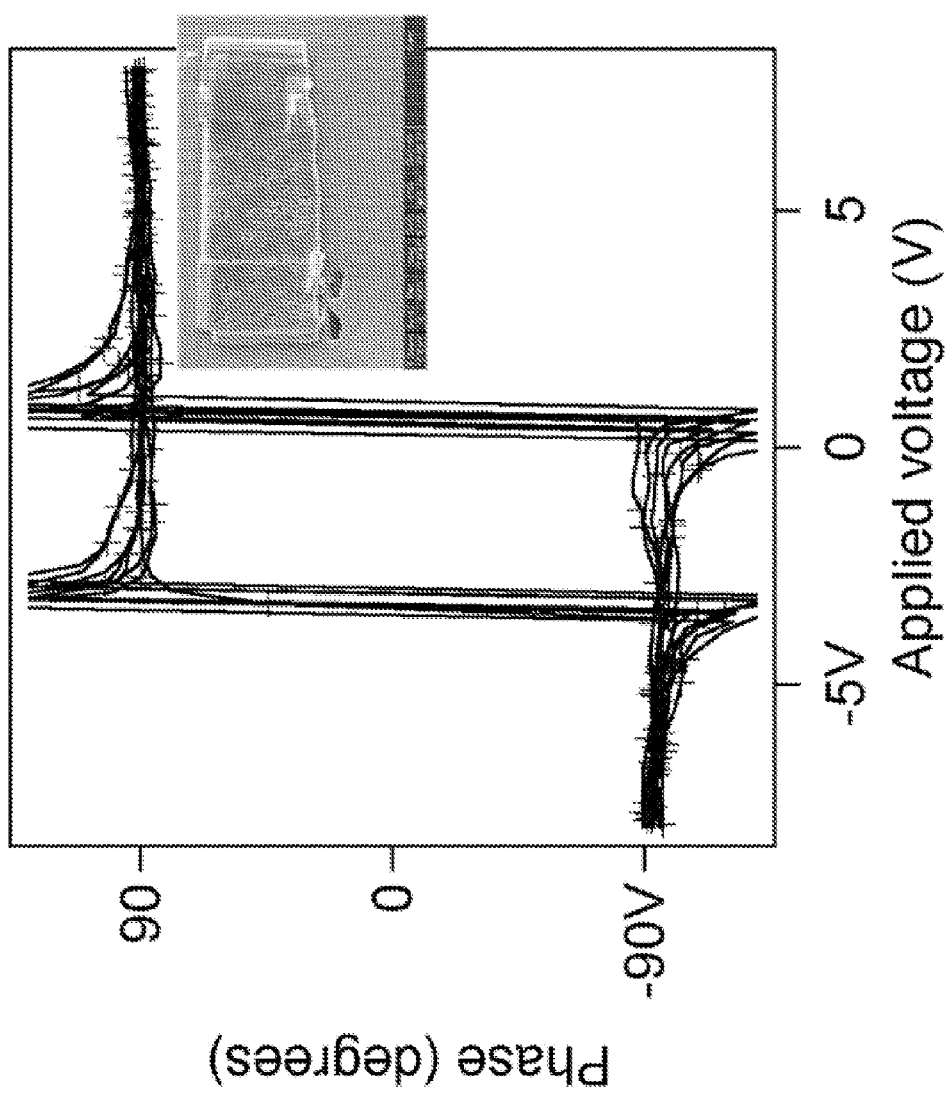
FIG. 4 depicts dielectric response and hysteresis loops of compounds of the present invention. A and C are measured at 2 locations on the pellet. Same with B and D. A/C/E is the phase of piezoelectric response. B/D is the amplitude of piezoelectric response. E is like A and C, phase image. SEM of lamella is shown in inset.

The samples were sintered to 95 percent density and characterized. We first measured the dielectric response and the hysteresis loops to examine how FE properties are changed by BNN substitution. (FIG. 4) These results show that at all the compositions, the material is ferroelectric up to 100 deg C. Measurements of the piezoelectric response and switching with surface probes also show strong ferroelectricity at room temperature. (FIG. 6) Without being limited to any theory of operation, it is believed that the strong symmetry breaking due to the presence of polarization enables enhanced carrier separation.

Figure 6:
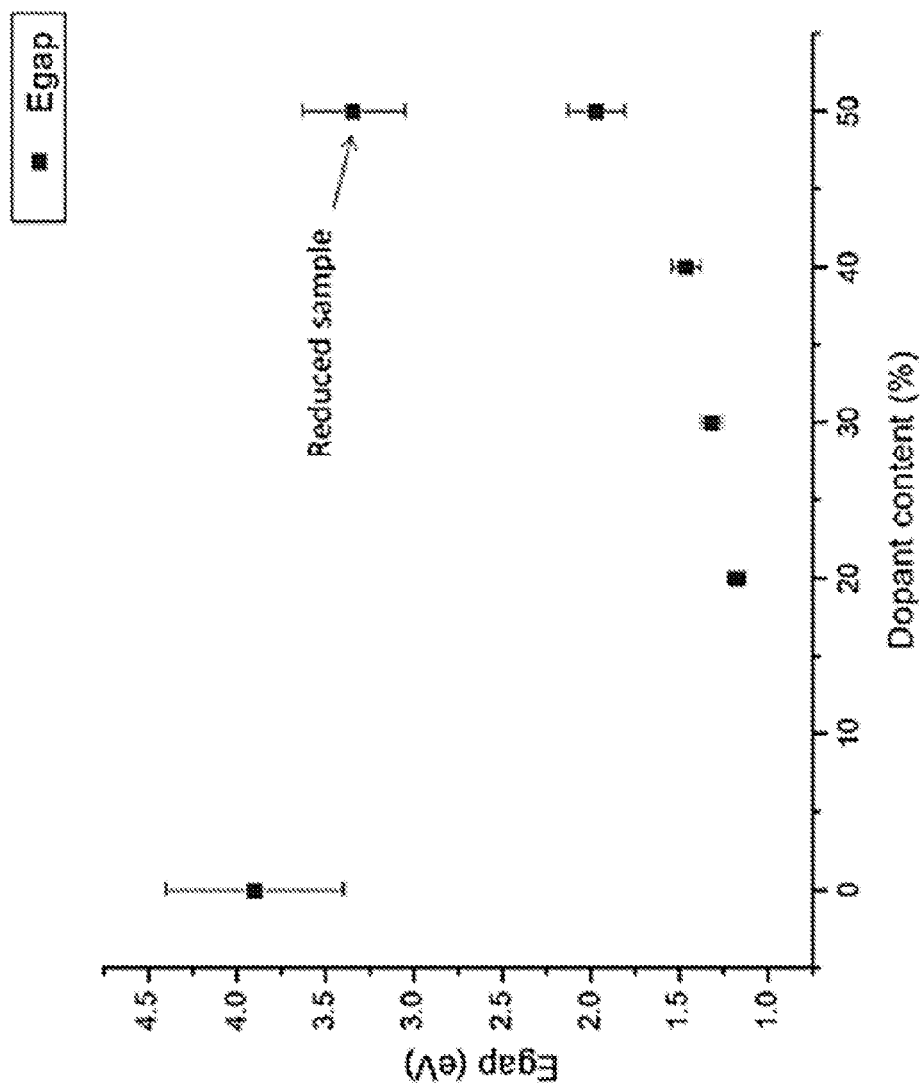
FIG. 6 depicts band gap versus dopant content in several embodiments of compounds of the present invention.

The light absorption properties of the materials were then characterized using surface ellipsometry. (FIG. 5) We find that the band gaps are small, in the 1.1-1.6 eV range, a dramatic 2 eV drop from the >3.2 eV band gap of the parent $KNbO_3$ material. (FIG. 6, Table I) Due to the smaller band gap, the samples are blue-green color, in contrast to the white $KNbO_3$ sample. The band gaps are direct as indicated by a single slope in the decay of the extinction coefficient versus wavelength. This is favorable for the use of KBNNO in thin film solar devices. Inspection of FIG. 6 shows, that there is a non-monotonic change in $E_{gap}$ with BNN fraction, with an initial steep decay for low BNN fraction and then a slow rise starting from about x=0.3.

The compositional band gap changes are believed to be due to the interplay between local bonding and the band gap in KBNNO as elucidated by DFT calculations. There are two possible configurations for the oxygen vacancies in KBNN, either between two Ni atoms or between Nb and Ni atoms. Our calculations show that while both configurations result in a low band gap, the $E_{gap}$ value for Ni—Nb configuration is lower than for the Ni—Ni configuration. As Ni concentration increases more Ni-vac-Ni are formed, as Ni-vac-Ni is more energetically favorable, and therefore the measured, average $E_{gap}$ rises. An alternative explanation is that as BNN content increases, the larger size of the $Ni^{2+}$ leads to a decrease of tolerance factor and an increased magnitude of octahedral rotations. These are known to decrease the d orbital overlap and to increase the energy of the conduction band and the band gap in perovskites. Octahedral rotations are cooperative and therefore, at low BNN fraction where Ni atoms are isolated from each other, the band gap is lowest due to the effect of Ni d states. At a higher BNN fraction, Ni atoms are often located in proximity to one another, increasing the octahedral tilting and the E_gap magnitudes.

Figure 7:
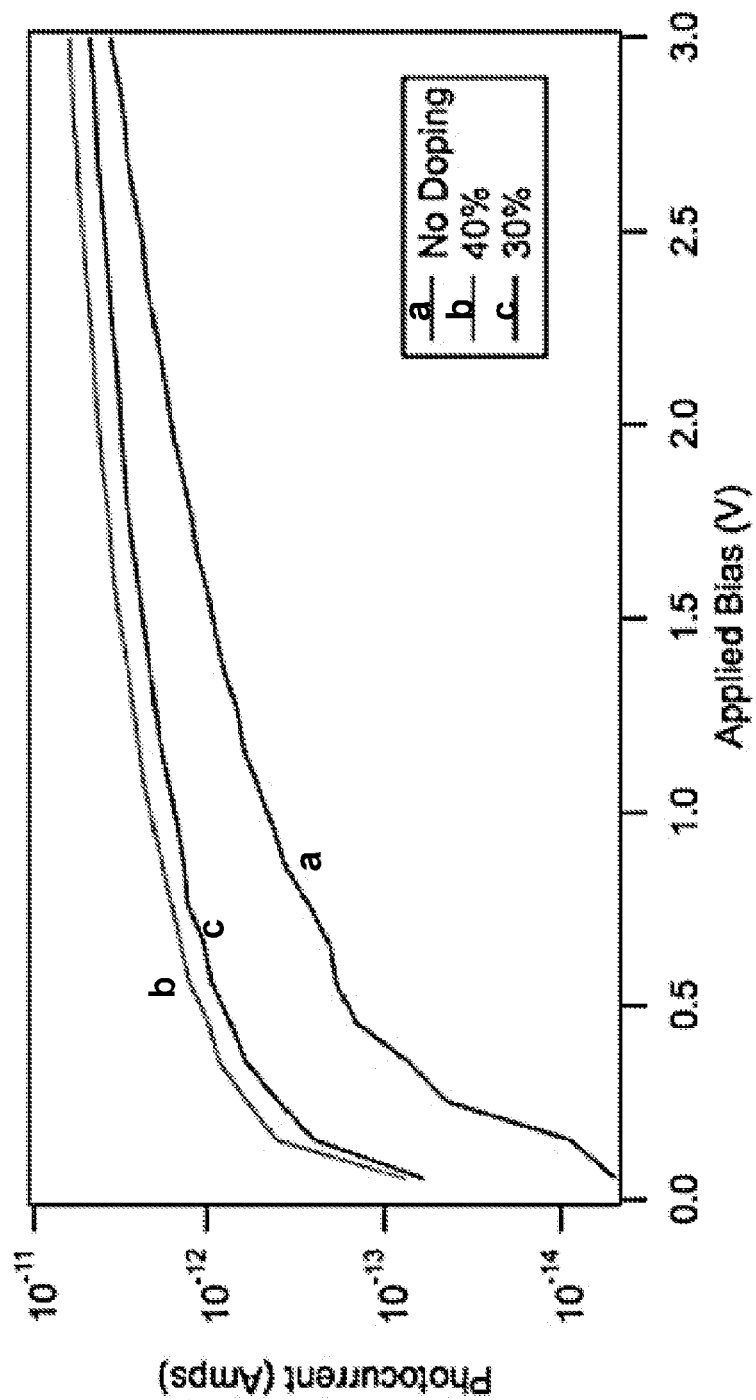
FIG. 7 depicts photocurrent versus applied bias at various dopant levels of several devices of the present invention.

To examine the impact of BNN substitution on the conversion of solar to electrical energy, we measure the photocurrent (FIG. 7). Comparison of photocurrent values for pure KNO and the substituted KBNNO shows an order of magnitude increase in current magnitude. This increase scales well with the solar spectrum absorption energy density increase due to the lower band gap. The photocurrents for KBNNO are highest that have ever been measure for a ferroelectric perovskite (previously typically on the order of $10^{-9}$ $Amp/cm^2$). Due to the well-known problem of poor carrier mobility in ABO3 perovskites, even after an order of magnitude increase the current density magnitudes are still small. However, a dramatic increase in photocurrent density can be achieved in thin film materials.

We have demonstrated that materials in KNO-BNNO solid solution can be synthesized by conventional solid state routes, and exhibit stable room temperature ferroelectricity, and a low, direct band gap comparable to that of the Si and CdTe semiconductors used in current photovoltaic applications. Due to the lower band gap, these materials exhibit photocurrents an order of magnitude larger than previously measured for bulk ferroelectric perovskite materials. These properties as well as the fact that KBNNO consists of inexpensive elements enable the development of cost-effective solar energy devices.

Additional Illustrative Embodiments and Examples

Figures 19A, 19B:
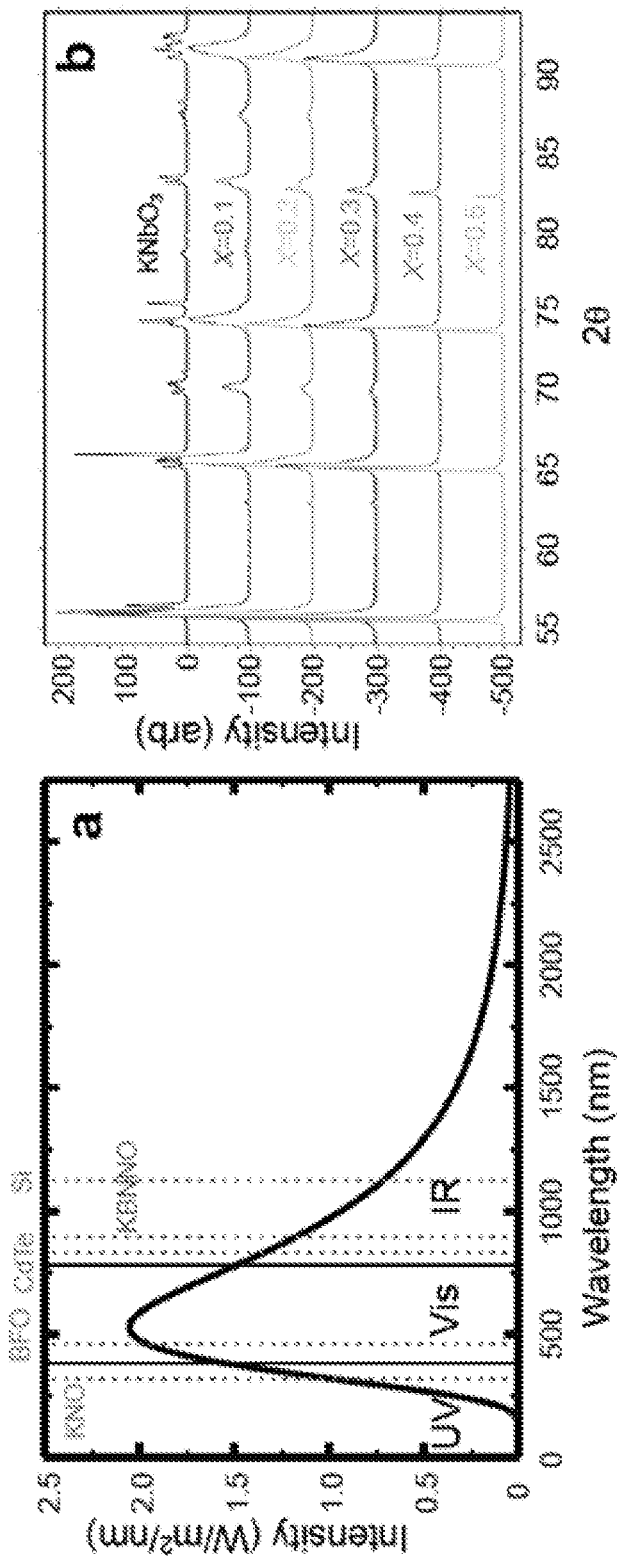
FIG. 19 depicts a) Solar photon intensity versus wavelength, with the band gaps indicated for the classic semiconductors Si, CdTe, the FE perovskite $BiFeO_3$ and the new KBNNO materials. b) Results of X-Ray Diffraction (XRD) measurements for the KBNNO materials. As BNNO fraction increases, the peaks shift to higher lattice constant values. All XRD spectra do not show any evidence of secondary phase impurities.

As we stated above, inexpensive materials are needed to efficiently convert solar radiation into electricity. The strong inversion symmetry breaking due to spontaneous polarization in ferroelectric materials allows for excited carrier separation by the bulk of the material and voltages higher than the band gap (Eg) due to the anomalous bulk photovoltaic effect. However, the common $ABO_3$ perovskite FE oxides exhibit poor carrier mobilities and wide band gaps. While a thin film configuration can dramatically increase the current harvested from an FE absorber material, the wide band gap (Eg=3-4 eV) allows the use of only 8% of the solar spectrum, drastically reducing the upper limit of photovoltaic efficiency. (FIG. 19a) Here, we demonstrate a single-phase oxide solid solution made from earth-abundant and non-toxic materials using conventional solid state methods that is polar at room temperature and exhibits a direct band gap of 1.39 eV, making this material suitable for harnessing the visible part of the solar spectrum and which material can be used in thin film photovoltaic devices.

Without being bound by any particular theory of operation, it is believed that the wide band gap of typical FE perovskites is due to the fundamental bonding characteristics of $ABO_3$ materials. The excitation across the band gap is essentially a charge transfer from the O 2p states at the valence band maximum (VBM) to the transition metal d states at the conduction band minimum (CBM). Due to a large electronegativity difference between the oxygen and transition metal atoms, the band gap is quite large (3-5 eV). However, it is the presence of the transition metal cations in the O6 cage that gives rise to ferroelectricity. Until now, the lowest known Eg for a FE perovskite has been 2.7 eV for $BiFeO_3$ (BFO). This made BFO the subject of a number of investigations for photovoltaic applications, with promising results. However, BFO is capable of absorbing only 20% of the solar spectrum. Thus, a new approach is necessary to circumvent the fundamental band-gap related limitation on the solar energy conversion efficiency in FE perovskites.

In the following embodiments, two different transition metal cations on the perovskite B-site are used to create FE perovskites with low band gaps, with one cation driving ferroelectricity and the other giving an Eg in the visual range. Ferroelectric perovskite $KNbO_3$ (KNO) is used to provide off-center distortions and polarization, and this KNO is mixed with $BaNi_{1/2}Nb_{1/2}O_{3-\delta}$ (BNNO) to introduce a combination of $Ni^{2+}$ on the B-site and an oxygen vacancy, which can give rise to electronic states in the gap of the parent KNO material. KNO is a FE material with a high Curie temperature ($T_C$=705 K) and large polarization (P≈0.55 C/m$^2$ at 0 K), driven by the off-center distortions of Nb ions. Nb ions are often found in five-fold coordination environments in oxides, and Nb-containing FE perovskites can tolerate a high concentration of vacancies. Therefore, B-site Nb ions should be able to accommodate the $Ni^{2+}$-oxygen vacancy combination. Ba was chosen as the A-site substituent, as it has the same ionic radius as K, promoting solubility. The large size of the K and Ba cations also favors vacancy formation, as $Ni^{3+}$ has a small ionic radius and is only stable in perovskites with (small) $La^{3+}$ cations on the A-site, whereas the larger $Ni^{2+}$ ion is known to be stable in FE compounds such as $PbNi_{1/3}Nb_{2/3}O_3$.

The solid solution $[KNbO_3]_{1-x}$ $[BaNi_{1/2}Nb_{1/2}O_{3-\delta}]_x$ (KBNNO) with compositions x=0.1 to 0.5 were synthesized by standard solid-state synthesis methods. The samples were sintered to 95% density and characterized. X-ray diffraction (XRD) results (FIG. 19b) show that the structure is perovskite for all solutions with no impurity peaks. The increase in lattice parameters with BNNO substitution is consistent with the presence of the $Ni^{2+}$ cation with a larger ionic radius (0.68 Å) than of $Nb^{5+}$ (0.64 Å) or $Ni^{3+}$ (0.60 Å).

Figure 20:
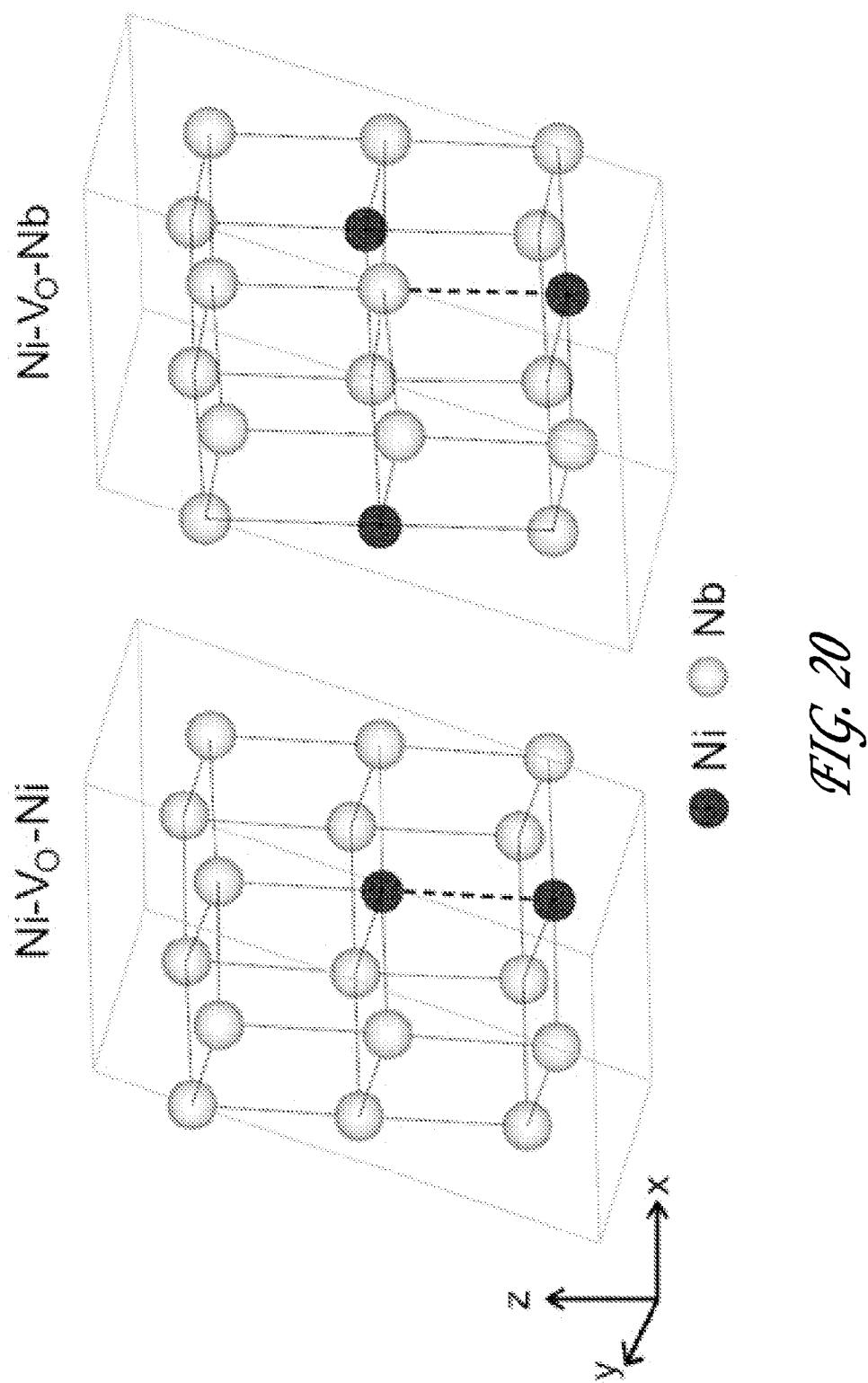
FIG. 20 depicts $(KNbO_3)_{8-}(BaNb_{1/2}Ni_{1/2}O_{2.75})_4$ solid solution crystal structures, with two structural motifs: $Ni^{2+}$-$V_O$—$Ni^{2+}$ (denoted as KBNNO-1) and $Ni^{2+}$-$V_O$—$Nb^{5+}$ (KBNNO-2). A cations and O atoms are omitted for clarity. Ni—O—Nb and Nb—O—Nb bonds are shown by solid black lines, while Ni—$V_O$—Ni and Ni—$V_O$—Ni are presented as dashed lines.

To examine the microscopic structure and properties of KBNNO, a first-principles density functional theory (DFT) calculations for the x=0.33 composition was performed using a 60-atom supercell (FIG. 20). Two of the twelve $Nb^{5+}$ ions were replaced by $Ni^{2+}$, and four of the twelve K ions were replaced by Ba. This substitution generates a $V_O^{\bullet\bullet}$ adjacent to $Ni_{Nb}'''$ defect (in Kroger-Vink notation). The lowest-energy configuration has the local dipole (Ni—$V_O$) parallel to the overall polarization (P). Two stable KBNNO configurations were obtained having a local structure of $Ni^{2+}$—$V_O$—$Ni^{2+}$ and $Ni^{2+}$—$V_O$—$Nb^{5+}$ (FIG. 20). The calculated P is 0.19 C/m$^2$ and 0.18 C/m$^2$ for the two KBNNO structures, mainly due to the off-center distortions of the Nb cations. The polarization is smaller than that of the parent KNO material (P=0.43 C/m$^2$ at 0K in DFT) but still substantial. Comparison of lattice parameters for fully oxidized ($\delta$=0) compositions ($KBNNO_{ox}$) and KBNNO ($\delta$>0, with oxygen vacancies) showed that KBNNO has lattice parameters in agreement with experimental data, while $KBNNO_{ox}$ does not. At the synthesis conditions, DFT+U free energy calculations find oxygen vacancies to be thermodynamically favored, indicating that the material is in the KBNNO state. Finally, KBNNO samples are not conductive, in contrast to the $KBNNO_{ox}$, for which the DFT+U calculations predict a metallic state. Therefore, the synthesized material is indeed KBNNO, with oxygen vacancies.

For efficient and practical separation of excited carriers, ferroelectrics are typically polar at room temperature and higher. Comparison of the 0 K, DFT-calculated P values for KNO and x=0.33 KBNNO (0.43 C/m$^2$ and 0.2 C/m$^2$, respectively) shows that BNNO substitution decreases polarization. Since the ferroelectric to paraelectric transition temperature Tc at which the polarization disappears scales roughly as the square of the 0 K polarization, the room temperature ferroelectricity is expected to be stable for up to x=0.25. Measurements on samples for x>0.2 found no dielectric anomaly, indicating that the compositions are paraelectric. For the samples with lower BNNO fraction, we found peaks in the dielectric constant at ≈450 K and at 600 K for x=0.1 and at 400 K for x=0.2. The dielectric anomalies for x=0.1 are much stronger, and we therefore performed local piezoresponse measurements on a thin and electrically-addressable lamella extracted from x=0.1 sample (FIG. 21). These showed a room temperature strong switching loop characteristic of FE materials with a coercive field of 37.31 kV/cm, somewhat larger than the 15.5 kV/cm coercive field of pure KNO ceramic. The strong symmetry breaking due to the presence of polarization is likely to enable enhanced carrier separation.

The light absorption properties of the KBNNO materials were characterized using spectroscopic ellipsometry (FIG. 22a). The KBNNO band gaps were found to be in the 1.1-1.6 eV range; this is dramatically lower than the 3.2 eV band gap of the KNO material (FIG. 22b). Due to the smaller band gap, the samples are all blue-green, in contrast to KNO which is white. The band gaps are direct, as indicated by a single slope of the extinction coefficient versus wavelength, and the power law of its variation. This is favorable for the use of KBNNO in thin-film solar devices. Inspection of FIG. 22b shows that there is a non-monotonic change in Eg with BNNO fraction, with an initial steep decay for low BNNO fraction and then a slow rise starting from x=0.3.

Figure 23:
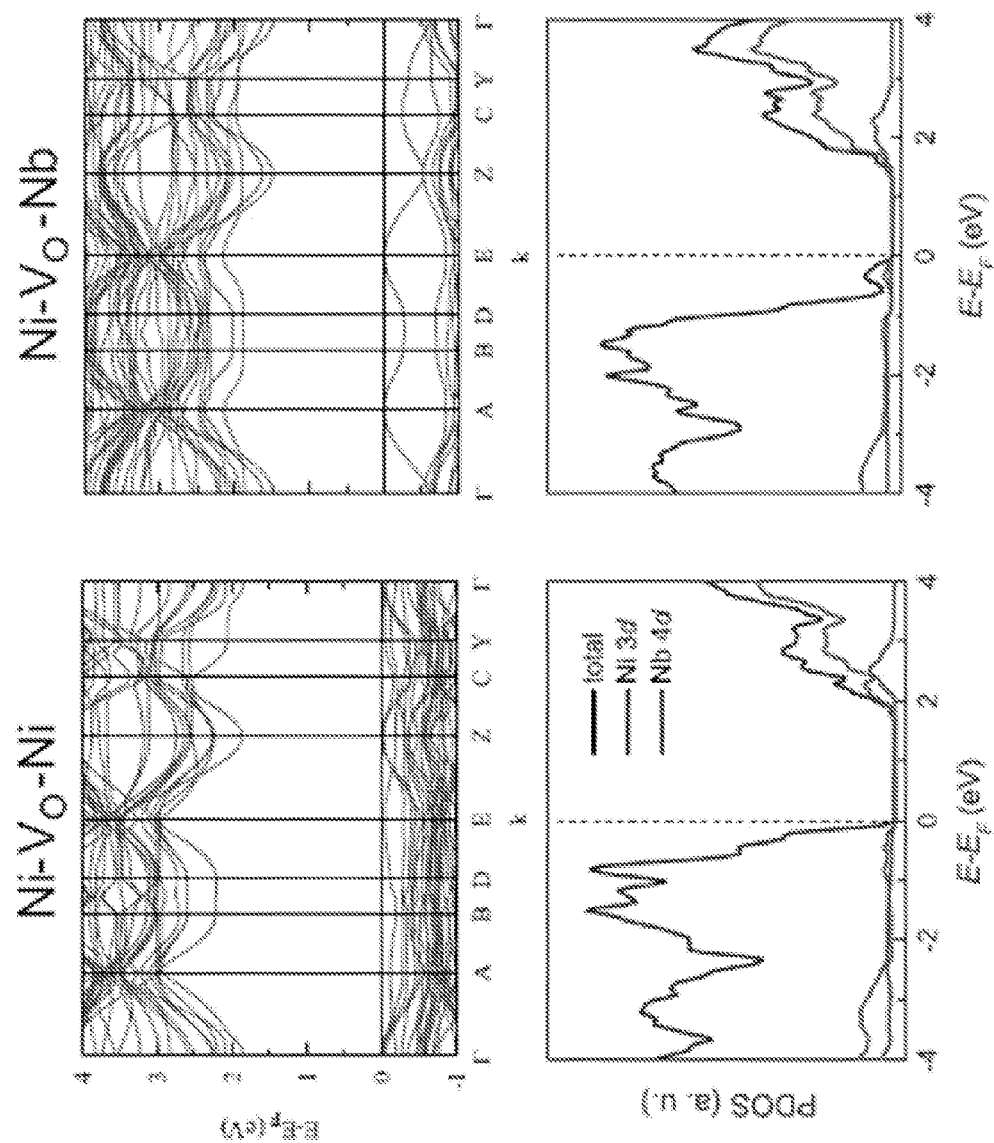
FIG. 23 depicts band structures (top) and orbital-projected density of states (bottom) for KBNNO Ni—$V_O$—Ni and Ni—$V_O$—Nb solid solutions near the Fermi level. The high-symmetry points in the Brillouin zone are Γ (0, 0, 0), A (−0.5, 0.5, 0), B (−0.5, 0, 0), D (−0.5, 0, 0.5), E (−0.5, 0.5, 0.5), Z (0, 0, 0.5), C (0, 0.5, 0.5), Y (0, 0.5, 0).

To elucidate the origin of the band gap lowering in the KBNNO solid solutions, the KBNNO electronic structure was examined with first-principles methods. As shown in FIG. 23, the electronic structures of the x=0.33 KBNNO supercells show direct band gaps of 1.84 and 1.49 eV, much smaller than the 2.3 eV LDA+U band gap of KNO. The calculated band gap for supercell 2 is in good agreement with experimental values. The VBM consists of hybridized Ni 3d and O 2p states, while the CBM is composed of Nb 4d states. Comparison to KNO shows that the filled Ni 3d gap states in KBNNO play a crucial role in lowering the band gap.

Without being bound by any theory of operation, it is believed that the compositional band gap changes are due to the interplay between local bonding and the band gap in KBNNO, as elucidated by LDA+U calculations. It is believed that there are two possible configurations for the oxygen vacancies in KBNNO, Ni—VO—Ni and Ni—VO—Nb. Calculations show that while both configurations result in a lower band gap due the introduction of the Ni 3d states, an extra density of states peak, contributed by the d-orbitals of the six-fold coordinated Ni is present in the VBM in Ni—VO—Nb. (FIG. 23) Therefore the Eg of Ni—VO—Nb configuration is lower than that of the Ni—VO—Ni. This configuration is also calculated to be more energetically favorable. At low BNNO concentration, the Ni cations are isolated, so the Ni—VO—Nb arrangement is prevalent. As Ni concentration increases, more Ni—VO—Ni are formed and therefore the measured Eg rises.

Figure 24A:
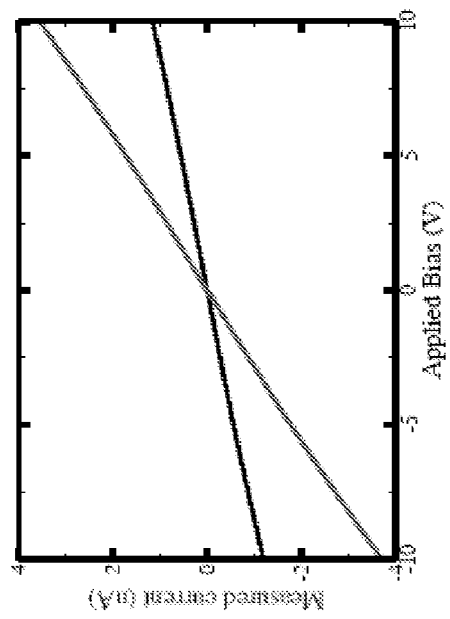
FIG. 24 depicts photocurrent measurements for the KBNNO samples. a) Grid shadow mask setup used for the measurements. The electrode contact pads are 85 μm×85 μm, spaced by 45 μm. b) Current versus bias under no illumination (black) and under illumination (red) with a 120 W halogen lamp. The current magnitudes are large indicating good transport properties and strong photoresponse. c) Photoresponse as a function of wavelength of the incident light. The photoresponse starts to increase around the KBNNO band gap of 1.4 eV and saturates at slightly higher energy of 1.74 eV. d) Comparison of dark and light currents for KBNNO and BTO materials. KBNNO exhibits two orders of magnitude stronger response than BTO.
Figure 24B:
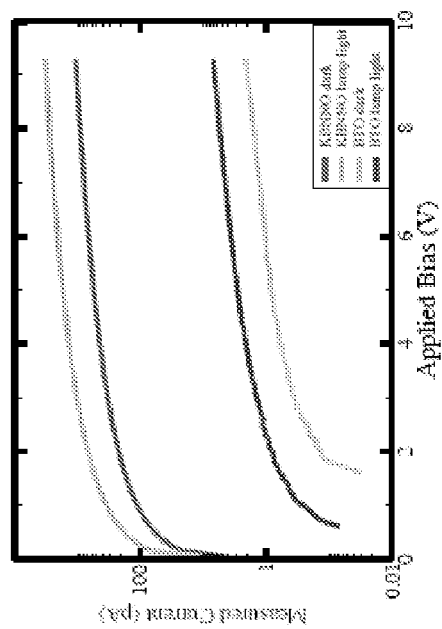
Figure 24C:
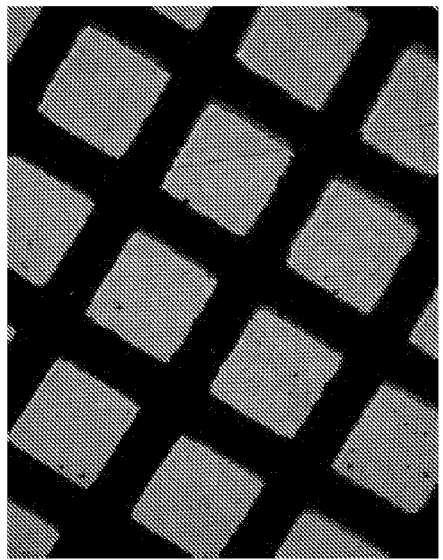
Figure 24D:
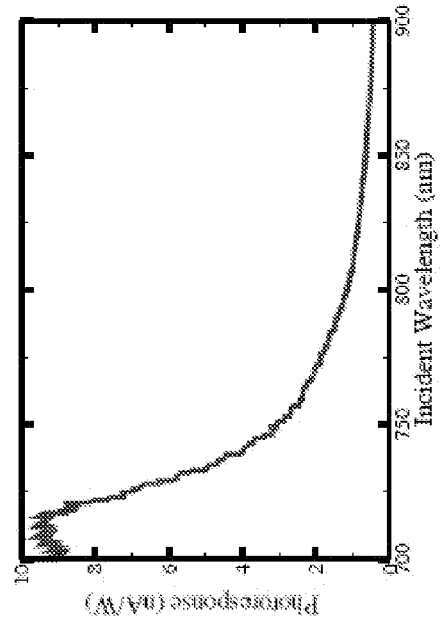

Investigation of bulk KBNNO photoresponse finds photocurrent magnitude that is much larger than that exhibited by classic ferroelectric perovskites. The results for dark and light current under white light illuminations, using electrode pairs placed 45 μm apart on the bulk x=0.1 sample, are shown in FIG. 24b. The material shows a strong response with a current density on the order of $10^{-5}$ A/cm$^2$. This is much higher than $10^{-7}$ A/cm$^2$ current density observed previously for bulk and thin film Pb(Zr,Ti)O$_3$ and LiNbO$_3$ samples under similar illumination. The high value of photocurrent indicates that KBNNO is promising for use as absorber material in solar cells due to a combination of low band gap and good transport properties. We also examined the incident optical wavelength dependence of the photocurrent response of KBNNO using a tunable monochromatic source form 700-900 nm (FIG. 24c). A non-zero response starts at ≈850 nm (1.46 eV) and reached its peak at ≈710 nm (1.74 eV). The onset of the photoresponse at ≈1.4 eV is consistent with the KBNNO band gap value (1.39 eV) as obtained by spectroscopic ellipsometry. A comparison of KBNNO results with those for a bulk sample of the classic BaTiO$_3$ (BTO) ferroelectric (BaTiO$_3$ (100)-oriented substrate grade, MTI Corporation, Richmond Calif.) performed in the same experimental setup confirms that KBNNO shows superior photoresponse properties (FIG. 24d). The measured current is two orders of magnitude larger for KBNNO than for BTO. The favorable band gap and transport properties of KBNNO eliminate the chief obstacles for the use of FE oxides in solar energy conversion devices.

As demonstrated herein, KBNNO solid solutions have been synthesized by a solid-state route. KBNNO solid solutions exhibit stable room-temperature ferroelectricity, and a low, direct band gap comparable to that of the Si and CdTe semiconductors used in current photovoltaic applications. The KBNNO material also exhibits photocurrents two orders of magnitude larger than those of classic bulk FE perovskite materials. These properties as well as the fact that KBNNO consists of inexpensive, earth-abundant and ecologically-friendly elements, make this material a promising candidate for use in solar energy devices.

I. Methods

A. Synthesis and Dielectric Measurements

All samples were made from stoichiometric quantities of dried K2CO$_3$, BaCO$_3$, NiO and Nb2O$_5$ powders. After mixing in a mortar the powders were ball-milled using yttria-stabilized zirconia planetary milling media in ethanol for 2 hours. The dried powders were calcined on Pt foil in an alumina crucible at 900° C. for 12 hours. Approximately 300 mg aliquots were pressed into 0.25 ml pellets in a uniaxial press and isostatically pressed at 80,000 psi. The pellets were placed on Pt foil in a covered alumina crucible, surrounded by sacrificial powder of the same composition, and sintered at temperatures between 1050-1250° C., depending on the composition. To minimize any absorption of H$_2$O, which is an issue in the synthesis of KNbO$_3$, at all stages of the synthesis samples were either kept at elevated temperature (at least 200° C.) or in a dessicator to minimize their exposure to moisture. Powder x-ray diffraction (XRD) patterns of the samples were collected on a laboratory x-ray diffractometer (Rigaku GiegerFlex D/Max-B) using Cu K radiation generated at 45 kV and 30 mA. The dielectric data were collected on pellets coated with Ag paint (Heraeus ST1601-14 type) to provide electrical contacts for the Pt lead wires. The dielectric properties were investigated as a function of frequency and temperature using a high-precision impedance-capacitance-resistance meter (Hewlett-Packard Model 4284A) and a high temperature thermal chamber. The sample temperature was monitored by an S-type thermocouple positioned near the pellet.

B. Spectroscopic Ellipsometry

Spectroscopic ellipsometry was performed in the wavelength range 247-1000 nm using a variable-angle spectroscopic ellipsometer equipped with Glan-Taylor polarizers, a rotating compensator, and deuterium and quartz halogen lamps for spectral coverage (J. A. Woollam Co. Inc., Model M2000). Measurement of the components of linearly polarized reflectivity at each selected wavelength were used to obtain ellipsometric parameters Ψ and Δ through the relation tan $$\Psi(\lambda) \cdot \exp(i\Delta(\lambda)) = \frac{R_s(\lambda)}{R_p(\lambda)},$$

where Rp (λ) and R$_s$ (λ) are reflection coefficients for light polarization parallel (p), and perpendicular (s) to the plane of incidence, respectively. The wavelength-dependent complex dielectric function was calculated using Fresnel's equations. The band gap was calculated using a Tauc plot (hvα)$^2$ vs hv, where α is the absorption coefficient. Measurements were taken at 65°.

C. Extraction of Thin-Film Lamellae for Local Ferroelectric Piezoeresponse

An integrated focused ion beam and scanning electron microscope (FEI Company DB235) equipped with a lift-out tool (Omniprobe) was used to extract thin-film lamellae from the bulk synthesized KBNNO. Briefly, a thin layer of carbon by sputtering coating (several tens of nm) is first deposited to provide protection against subsequent ion-beam irradiation and to enhance the imaging contrast. This was followed by deposition of a 500-nm thick platinum film using ion beam-assisted deposition onto the lift-out area, preventing direct ion-beam damage during the process. The lift-out preparation process consists of initial cross-sectional milling steps on both sides, a series of thinning steps using lower ion-beam currents, a finer-scale cross-sectional cleaning using ≈100 pA ion-beam current, and ion-beam local deposition of Pt to affix the lamella to the lift-out tool. A low beam current (<100 pA) was maintained during the final release of the lamella from the substrate.

Using the lift-out probe each harvested lamella was transferred carefully to glass substrates coated with layers of fluorinated tin oxide (TEC-15 supplied by Ted Pella) and a top coating of 30 nm of In (selected to facilitate wetting of the bottom contact to the lamella) deposited via electron-beam evaporation in vacuum (BOC Edwards model A306). Each lamella is transferred to the substrate in which contact of the lamella with the substrate is first made along the lamella edge; the free-standing lamella is then pushed down onto the surface. As a final step in the transfer of the lamellar thin-film test specimen, Pt is deposited using electron-beam assisted deposition onto the corners of each lamella to anchor the lamella.

Following this, post-processing steps of ultra-low beam current surface ion milling and subsequent thermal annealing (500° C. for 5 h, followed by a slow cooling at 1° C./s) were carried out in Ney Vulcan 3-130 furnace to effectively eliminate ion damage.

D. Local Ferroelectric Piezoresponse Force Measurements

Ferroelectric switching within the lamellae was evaluated using local piezoresponse using a scanning probe microscope (Asylum Research MFP-3D) and Pt-coated Si probes (AC 240TM, Olympus, nominal stiffness constant ≈2 N/m). A triangular waveform (frequency 0.025 Hz, peak-to-peak bias of 10 V) was applied to the bottom electrode while a sinusoidal AC probing voltage (5 kHz, 0.5 V amplitude) was applied to the cantilever tip to collect the variation in the cantilever phase as a function of the bias voltage. The cantilever phase signal at the modulation frequency was collected with the aid of a digital lock-in amplifier (Stanford Research Systems SR830).

E. Photocurrent Measurements

Electrical contacts were produced on KBNNO 10mask and Cr/Au layers. The resulting structures were 85 um×85 um pads separated by 45 um gaps. Steady-state photocurrent-bias voltage traces were collected under 120 W tungsten-halogen spectrall-broad lamp probe illumination, under vacuum ($10^{-6}$ torr, Lakeshore Cryotronics TTP4) using picoammeter (Keithley Model 6487). Photocurrent spectra were collected over the range of 700-900 nm using a tunable M Squared SolsTiS tunable sapphire laser. The laser radiation incident on the sample was ~10 mm resulting in an incident intensity of 120 mW/cm². The laser spot was directed on the sample and aligned by maximizing the resulting output current. The spot size is estimated at approximately 1 cm.

F. Computational Modeling

First-principles calculations were performed with a plane-wave basis set, as implemented in Quantum-Espresso. The LDA exchange-correlation functional is used for structural relaxations, with a 6×6×6 Monkhorst-Pack k-point grid and a 50 Ry plane-wave cutoff. All atoms are represented by norm-conserving optimized nonlocal pseudopotentials, generated with the OPIUM code. The electronic contribution to the polarization is calculated following Berry's phase formalism.

As it is believed that LDA severely underestimates the band gap, and even falsely predicts KBNNO to be metallic, all the electronic structure calculations have been done at the level of LDA+U. While LDA+U is unable to predict Eg with the accuracy of the more advanced hybrid functionals or GW methods, it can still provide a good description of the change of Eg with respect to the solid solution cation ordering. A simplified version of the rotationally invariant formulation of the LDA+U method was employed, where U can be determined by self-consistent linear response calculations.

What is claimed:

1. A ferroelectric perovskite characterized as having a band gap, $E_{gap}$, of less than 2.5 eV and comprising a solid solution of $KNbO_3$ and $BaNi_{1/2}Nb_{1/2}O_{3-\delta}$, wherein δ is in the range of from 0 to about 1.

2. The ferroelectric perovskite of claim 1 wherein the band gap is less than about 2.0 eV.

3. The ferroelectric perovskite of claim 1 wherein the band gap is in the range of from about 1.1 eV to about 1.6 eV.

4. The ferroelectric perovskite of claim 1, wherein the solid solution of $KNbO_3$ and $BaNi_{1/2}Nb_{1/2}O_{3-\delta}$ is represented as $(1-x)KNbO_{3-x}BaNi_{1/2}Nb_{1/2}O_{3-\delta}$, wherein x is in the range of from about 0.01 to about 0.99.

5. The ferroelectric perovskite of claim 4, wherein x is in the range of from about 0.1 to about 0.5.

6. The ferroelectric perovskite of claim 1, wherein δ is in the range of from about 0.2 to about 0.3.

7. The ferroelectric perovskite of claim 1, wherein the ferroelectric perovskite is ferroelectric up to at least 100 degrees C.

8. A photovoltaic device comprising the ferroelectric perovskite of claim 1.

* * * * *